(12) United States Patent
Nakamura et al.

(10) Patent No.: US 12,022,669 B2
(45) Date of Patent: Jun. 25, 2024

(54) ORGANIC MOLECULAR MEMORY

(71) Applicant: Kioxia Corporation, Tokyo (JP)

(72) Inventors: Kenji Nakamura, Ota Tokyo (JP); Hideyuki Nishizawa, Toshima Tokyo (JP)

(73) Assignee: Kioxia Corporation, Tokyo (JP)

(*) Notice: Subject to any disclaimer, the term of this patent is extended or adjusted under 35 U.S.C. 154(b) by 74 days.

(21) Appl. No.: 17/840,420

(22) Filed: Jun. 14, 2022

(65) Prior Publication Data

US 2023/0171972 A1 Jun. 1, 2023

(30) Foreign Application Priority Data

Dec. 1, 2021 (JP) ................................ 2021-195481

(51) Int. Cl.
*H10K 10/00* (2023.01)
*H10K 19/00* (2023.01)

(52) U.S. Cl.
CPC ......... *H10K 10/701* (2023.02); *H10K 19/202* (2023.02)

(58) Field of Classification Search
CPC ... H10K 10/701; H10K 19/202; H10K 19/201
See application file for complete search history.

(56) References Cited

U.S. PATENT DOCUMENTS

| | | | |
|---|---|---|---|
| 5,016,063 A | 5/1991 | Beratan et al. | |
| 6,570,224 B1 | 5/2003 | Ilyanok | |
| 6,989,290 B2 * | 1/2006 | Aviram | H10K 85/113 |
| | | | 977/936 |
| 7,282,731 B2 | 10/2007 | Ilyanok | |
| 8,437,167 B2 | 5/2013 | Fukuzumi et al. | |
| 8,852,996 B2 | 10/2014 | Wang et al. | |
| 9,047,941 B2 * | 6/2015 | Nishizawa | B82Y 10/00 |
| 9,240,550 B2 | 1/2016 | Dellmann et al. | |
| 9,685,321 B2 * | 6/2017 | Terai | G11C 11/5664 |
| 10,370,247 B2 * | 8/2019 | Loertscher | H10N 70/011 |
| 2004/0160801 A1 * | 8/2004 | Krieger | H10N 70/023 |
| | | | 365/151 |
| 2005/0101063 A1 * | 5/2005 | Tour | G11C 13/0014 |
| | | | 438/142 |

(Continued)

FOREIGN PATENT DOCUMENTS

| | | | |
|---|---|---|---|
| EP | 0482920 A2 * | 4/1992 | |
| EP | 1775782 B1 * | 11/2011 | B82Y 10/00 |

(Continued)

OTHER PUBLICATIONS

D. Adam, et al., "Transient Photoconductivity in a Discotic Liquid Crystal", Physical Review Letters, vol. 70, No. 4, 1993.

(Continued)

*Primary Examiner* — Bitew A Dinke
(74) *Attorney, Agent, or Firm* — Foley & Lardner LLP

(57) ABSTRACT

An organic molecular memory of embodiments includes: a first electrode; a second electrode; an organic molecular layer provided between the first electrode and the second electrode, extending in a first direction from the first electrode toward the second electrode, and containing a first molecule and a second molecule provided between the first molecule and the second electrode; and a third electrode facing the second molecule.

24 Claims, 35 Drawing Sheets

(56) References Cited

U.S. PATENT DOCUMENTS

| | | | |
|---|---|---|---|
| 2005/0157535 A1* | 7/2005 | Jackson | B82Y 10/00 |
| | | | 365/151 |
| 2005/0202273 A1* | 9/2005 | Caballero | B82Y 30/00 |
| | | | 428/690 |
| 2006/0211257 A1* | 9/2006 | Halik | H10K 71/191 |
| | | | 438/754 |
| 2006/0278868 A1* | 12/2006 | Matsui | G11C 13/0014 |
| | | | 257/40 |
| 2008/0269486 A1* | 10/2008 | Zhou | H10K 85/322 |
| | | | 257/40 |
| 2010/0264409 A1* | 10/2010 | Tokita | H10K 10/701 |
| | | | 257/40 |
| 2011/0101324 A1* | 5/2011 | Masui | B82Y 30/00 |
| | | | 257/40 |
| 2012/0228576 A1* | 9/2012 | Asakawa | G11C 13/0014 |
| | | | 257/E47.001 |
| 2013/0248803 A1* | 9/2013 | Nishihara | H10N 70/8822 |
| | | | 257/4 |
| 2013/0328023 A1* | 12/2013 | Hayashi | H10K 85/60 |
| | | | 257/40 |
| 2014/0021438 A1* | 1/2014 | Hayashi | H10B 63/20 |
| | | | 257/4 |
| 2014/0097485 A1* | 4/2014 | Hattori | H10B 43/35 |
| | | | 438/591 |
| 2015/0069337 A1* | 3/2015 | Nishizawa | H10K 85/111 |
| | | | 257/40 |
| 2015/0108421 A1* | 4/2015 | Hayashi | H10B 63/30 |
| | | | 257/4 |
| 2015/0262702 A1 | 9/2015 | Ootera et al. | |
| 2015/0349081 A1* | 12/2015 | Hattori | H01L 29/792 |
| | | | 257/321 |
| 2016/0087203 A1* | 3/2016 | Nishizawa | H10K 85/60 |
| | | | 257/4 |
| 2016/0284869 A1* | 9/2016 | Hattori | H10K 85/371 |
| 2017/0271603 A1* | 9/2017 | Hattori | H10K 10/466 |
| 2019/0248649 A1* | 8/2019 | Loertscher | B82Y 30/00 |
| 2020/0082865 A1 | 3/2020 | Ueda | |
| 2020/0395563 A1* | 12/2020 | Majima | H10K 10/701 |
| 2021/0082484 A1 | 3/2021 | Ueda et al. | |
| 2021/0089233 A1 | 3/2021 | Ueda et al. | |
| 2021/0202386 A1 | 7/2021 | Wang et al. | |

FOREIGN PATENT DOCUMENTS

| | | |
|---|---|---|
| JP | S5144834 A | 4/1976 |
| JP | H05-160385 A | 6/1993 |
| JP | 11-505068 A | 5/1999 |
| JP | 3761300 B2 | 3/2006 |
| JP | 2011-233206 A | 11/2011 |
| JP | 5390554 B2 | 1/2014 |
| JP | 2015-173145 A | 9/2015 |
| JP | 2020-042880 A | 3/2020 |
| JP | 2021-047948 A | 3/2021 |
| JP | 2021-048190 A | 3/2021 |
| WO | WO-96/36082 A1 | 11/1996 |
| WO | WO-2017/126664 A1 | 7/2017 |

OTHER PUBLICATIONS

Daigo Miyajima, et al., "Ferroelectric Columnar Liquid Crystal Featuring Confined Polar Groups Within Core-Shell Architecture", Science vol. 336 (2012).

H. T. Imam, et al., "Coulomb blockade of resonant tunneling", Physical Review B, vol. 50, No. 24, 1994.

Kathrin Sentker, et al., "Quantized Self-Assembly of Discotic Rings in a Liquid Crystal Confined in Nanopores", Physical Review Letters 120, 067801 (2018).

* cited by examiner

R = $C_nH_{2n+1}$
$4 \leqq n \leqq 11$

ORGANIC MOLECULAR MEMORY

CROSS-REFERENCE TO RELATED APPLICATION

This application is based upon and claims the benefit of priority from Japanese Patent Application No. 2021-195481, filed on Dec. 1, 2021, the entire contents of which are incorporated herein by reference.

FIELD

Embodiments described herein relate generally to an organic molecular memory.

BACKGROUND

In order to increase the data capacity of a non-volatile memory, for example, scaling-down of memory cells and three-dimensional structuring of memory cell arrays are in progress. It is desired to realize a further increase in the data capacity of the non-volatile memory.

DETAILED DESCRIPTION

Figure 1:
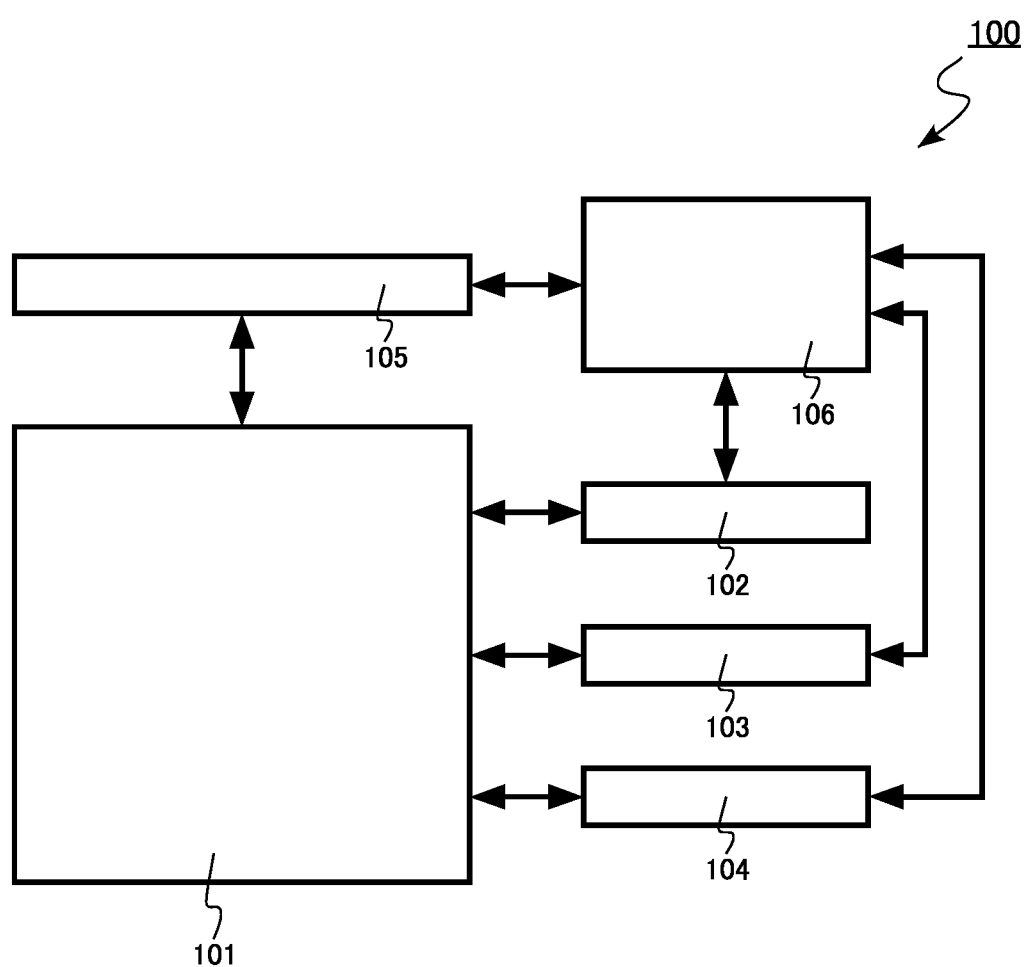
FIG. 1 is a block diagram of an organic molecular memory according to a first embodiment.

An organic molecular memory of embodiments includes: a first electrode; a second electrode; an organic molecular layer provided between the first electrode and the second electrode, extending in a first direction from the first electrode toward the second electrode, and containing a first molecule and a second molecule provided between the first molecule and the second electrode; and a third electrode facing the second molecule.

Hereinafter, embodiments will be described with reference to the accompanying diagram. In addition, in the following description, the same or similar members and the like are denoted by the same reference numerals, and the description of the members and the like once described will be omitted as appropriate.

For the identification of the members configuring the organic molecular memory of embodiments, for example, secondary ion mass spectroscopy (SIMS), energy dispersive X-ray spectroscopy (EDX), X-ray diffraction (XRD), electron beam diffraction (EBD), X-ray photoelectron spectroscopy (XPS), synchrotron Radiation X-ray absorption fine Structure (XAFS), liquid chromatography, gas chromatography, or ion chromatography can be used.

In addition, when measuring the thickness of each member configuring the organic molecular memory of embodiments, a distance between members, and the like, for example, a transmission electron microscope (TEM) can be used.

In addition, the molecular structure of the organic molecule can be identified by using, for example, an atomic force microscope (AFM) or a scanning tunneling microscope (STM).

The term "chemical bond" in this specification is a concept that refers to any of a covalent bond, an ionic bond, and a metal bond and excludes a hydrogen bond or a van der Waals force bond.

First Embodiment

An organic molecular memory according to a first embodiment includes: a first electrode; a second electrode; an organic molecular layer provided between the first electrode and the second electrode, extending in a first direction from the first electrode toward the second electrode, and containing a first molecule and a second molecule provided between the first molecule and the second electrode; and a third electrode facing the second molecule.

The organic molecular memory according to the first embodiment is a non-volatile organic molecular memory 100 in which memory cells are three-dimensionally arranged. In the organic molecular memory 100, a memory cell stores data by using the charge in the organic molecule. The organic molecular memory 100 performs a shift register type operation.

FIG. 1 is a block diagram of the organic molecular memory according to the first embodiment. As shown in FIG. 1, the organic molecular memory 100 includes a memory cell array 101, a write control circuit 102, a read control circuit 103, a shift control circuit 104, a sense amplifier circuit 105, and a central control circuit 106.

Figure 2:
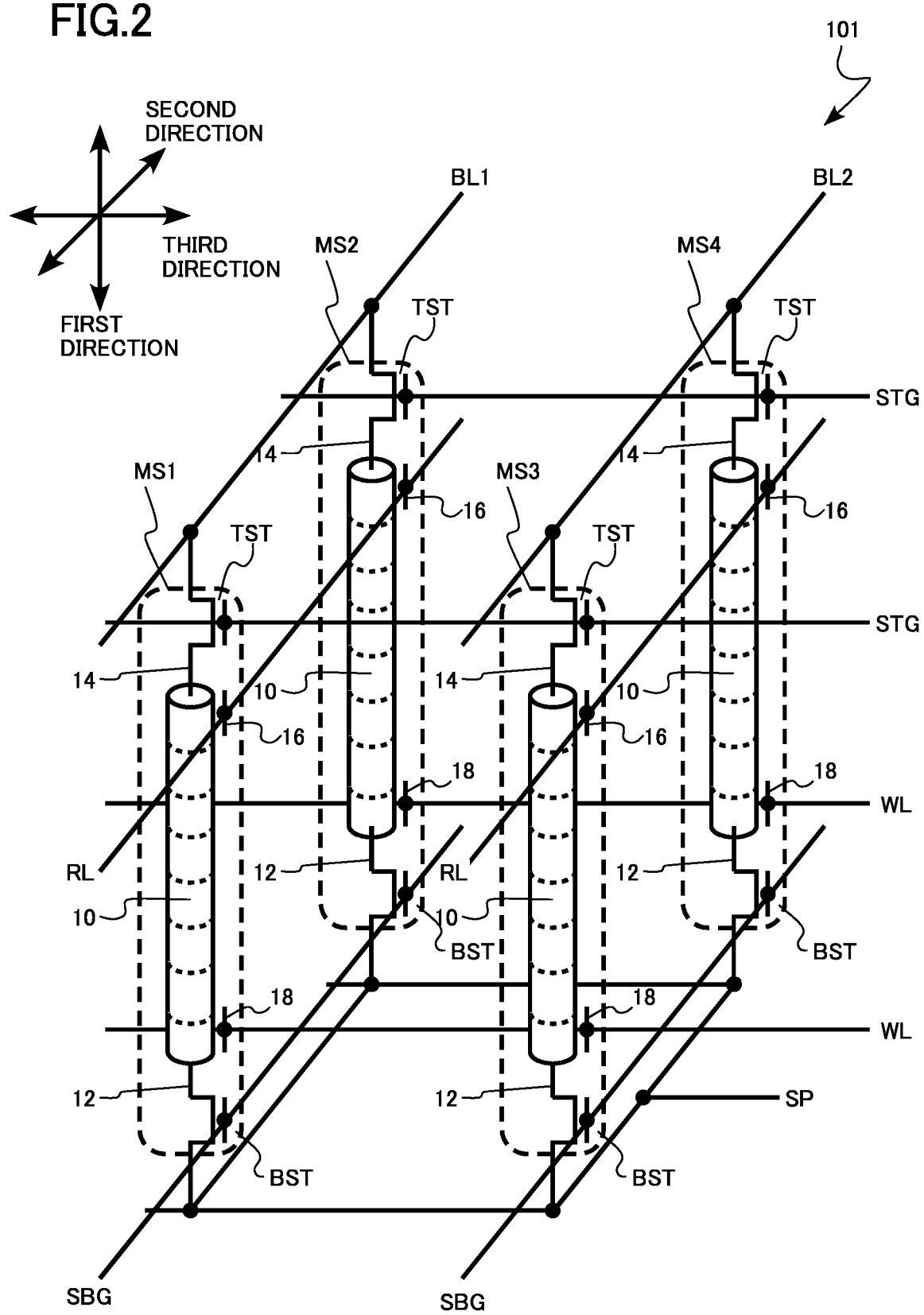
FIG. 2 is an equivalent circuit diagram of a memory cell array of the organic molecular memory according to the first embodiment.

FIG. 2 is an equivalent circuit diagram of a memory cell array of the organic molecular memory according to the first embodiment.

As shown in FIG. 2, the memory cell array 101 includes a first memory string MS1, a second memory string MS2, a third memory string MS3, a fourth memory string MS4, a source plate SP, a lower select gate line SBG, an upper select gate line STG, a write line WL, a read line RL, a first bit line BL1, and a second bit line BL2.

The first bit line BL1 is an example of the first wiring. The second bit line BL2 is an example of the second wiring. The source plate SP is an example of a conductive layer.

Hereinafter, the first memory string MS1, the second memory string MS2, the third memory string MS3, and the fourth memory string MS4 may be referred to individually or collectively as a memory string MS. In addition, the first bit line BL1 and the second bit line BL2 may be referred to individually or collectively as a bit line BL.

Each of the first memory string MS1, the second memory string MS2, the third memory string MS3, and the fourth memory string MS4 includes an organic molecular layer 10, a lower electrode 12, an upper electrode 14, a read electrode 16, a write electrode 18, a lower select gate transistor BST, and an upper select gate transistor TST.

The lower electrode 12 is an example of the first electrode. The upper electrode 14 is an example of the second electrode. The read electrode 16 is an example of the third electrode. The write electrode 18 is an example of the fourth electrode. The lower select gate transistor BST is an example of the second switching element. The upper select gate transistor TST is an example of the first switching element.

In the memory cell array 101, the direction from the lower electrode 12 toward the upper electrode 14 is defined as a first direction. In addition, the direction crossing the first direction is defined as a second direction. In addition, the direction crossing the first direction and the second direction is defined as a third direction. The second direction is, for example, perpendicular to the first direction. In addition, the third direction is, for example, perpendicular to the first direction and the second direction.

As shown in FIG. 2, the first memory string MS1, the second memory string MS2, the third memory string MS3, and the fourth memory string MS4 extend in the first direction.

The first bit line BL1 and the second bit line BL2 extend in the second direction. The first memory string MS1 and the second memory string MS2 are provided between the first bit line BL1 and the source plate SP. The third memory string MS3 and the fourth memory string MS4 are provided between the second bit line BL2 and the source plate SP.

The first bit line BL1 is provided in the first direction of the first memory string MS1 and the second memory string MS2. The first bit line BL1 is provided corresponding to the first memory string MS1 and the second memory string MS2. The first bit line BL1 is electrically connected to the first memory string MS1 and the second memory string MS2.

The second bit line BL2 is provided in the first direction of the third memory string MS3 and the fourth memory string MS4. The second bit line BL2 is provided corresponding to the third memory string MS3 and the fourth memory string MS4. The second bit line BL2 is electrically connected to the third memory string MS3 and the fourth memory string MS4. The second bit line BL2 is electrically separated from the first bit line BL1.

The organic molecular layer 10 contains a plurality of organic molecules. Each of the plurality of organic molecules functions as a memory cell.

The lower select gate transistor BST is provided between the lower electrode 12 and the source plate SP. The lower select gate line SBG extends in the second direction.

The ON/OFF state of the lower select gate transistor BST is controlled by the gate voltage applied to the lower select gate line SBG. The lower select gate transistor BST has a function of selecting a desired memory string MS from a plurality of memory strings MS. In addition, the lower select gate transistor BST can be omitted.

The upper select gate transistor TST is provided between the upper electrode 14 and the first bit line BL1 or between the upper electrode 14 and the second bit line BL2. The upper select gate line STG extends in the third direction.

The ON/OFF state of the upper select gate transistor TST is controlled by the gate voltage applied to the upper select gate line STG. The upper select gate transistor TST has a function of selecting a desired memory string MS from a plurality of memory strings MS.

By controlling the lower select gate transistor BST and the upper select gate transistor TST, it is possible to select one desired memory string MS.

The write line WL extends in the third direction. The write line WL is connected to the write electrode 18. Data is written to the organic molecule facing the write electrode 18 by the write voltage applied to the write line WL.

For example, the write electrode 18 of the first memory string MS1 and the write electrode 18 of the third memory string MS3 are electrically connected to each other by the write line WL. For example, the write electrode 18 of the second memory string MS2 and the write electrode 18 of the fourth memory string MS4 are electrically connected to each other by the write line WL.

The read line RL extends in the second direction. The read line RL is connected to the read electrode 16. By detecting the current flowing between the read electrode 16 and the upper electrode 14, the data of the organic molecule facing the read electrode 16 is read.

For example, the read electrode 16 of the first memory string MS1 and the read electrode 16 of the second memory string MS2 are electrically connected to each other by the read line RL. For example, the read electrode 16 of the third memory string MS3 and the read electrode 16 of the fourth memory string MS4 are electrically connected to each other by the read line RL.

The write control circuit 102 has, for example, a function of selecting the write line WL and controlling a voltage applied to the selected write line WL.

The read control circuit 103 has, for example, a function of selecting the read line RL and controlling a voltage applied to the selected read line RL.

The shift control circuit 104 has a function of controlling the shift register operation of the memory string MS. The shift control circuit 104 has a function of transferring data stored in an organic molecule OM in the first direction by applying a shift voltage between the lower electrode 12 and the upper electrode 14 of the memory string MS.

The sense amplifier circuit 105 has a function of detecting the data stored in the organic molecule OM by amplifying the current flowing through the bit line BL or the voltage of the bit line BL.

The central control circuit 106 controls the operation of the organic molecular memory 100. The central control circuit 106 controls the write control circuit 102, the read control circuit 103, the shift control circuit 104, and the sense amplifier circuit 105.

The write control circuit 102, the read control circuit 103, the shift control circuit 104, the sense amplifier circuit 105, and the central control circuit 106 are configured by, for example, transistors or wiring layers formed on a semiconductor substrate (not shown).

Figure 3:
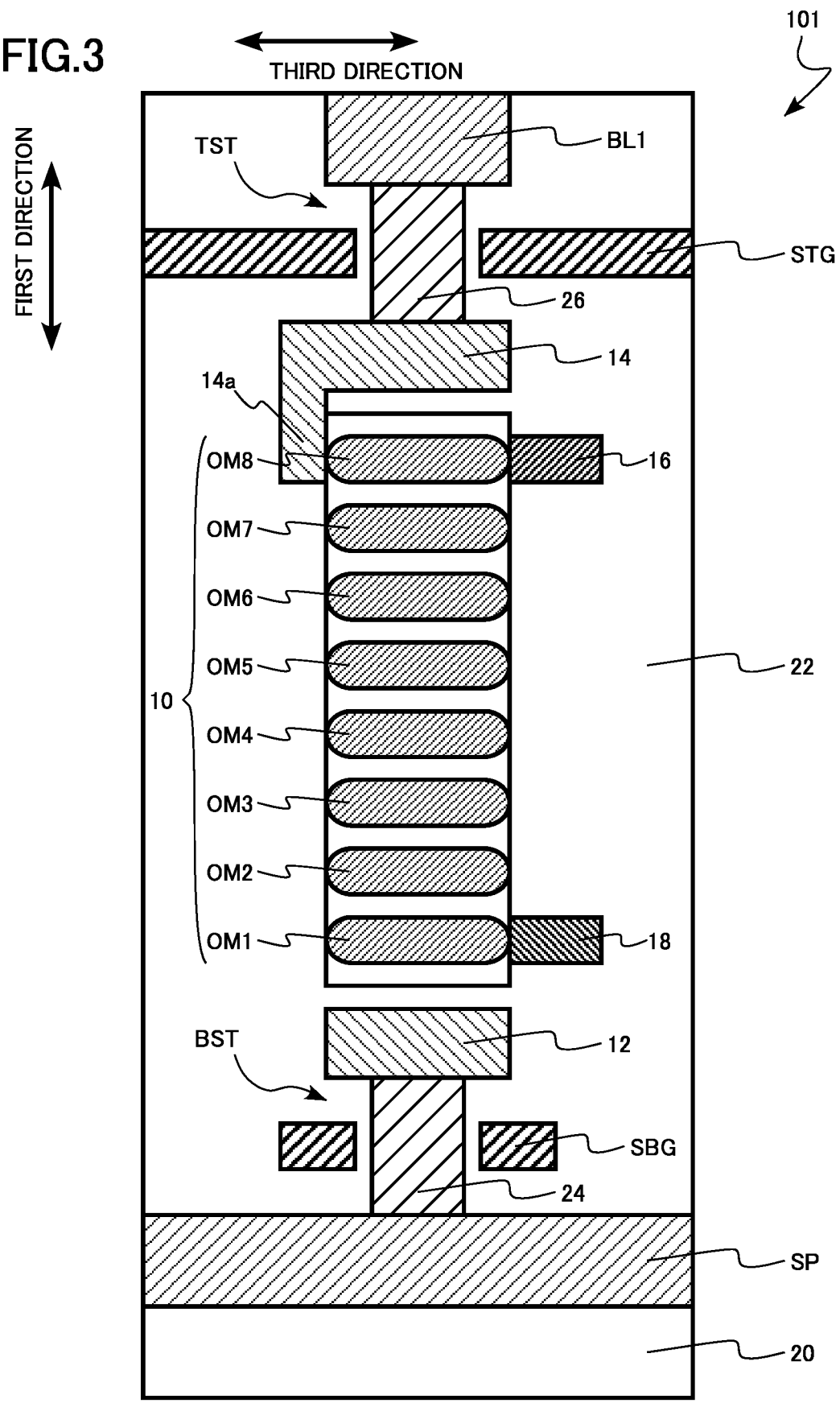
FIG. 3 is a schematic cross-sectional view of the organic molecular memory according to the first embodiment.

FIG. 3 is a schematic cross-sectional view of the organic molecular memory according to the first embodiment. FIG. 3 is a cross-sectional view of the memory cell array 101. FIG. 3 is a cross-sectional view parallel to the first direction and the third direction. FIG. 3 is a cross section including the first memory string MS1.

The memory cell array 101 includes the organic molecular layer 10, the lower electrode 12, the upper electrode 14, the read electrode 16, the write electrode 18, a substrate insulating layer 20, an interlayer insulating layer 22, the source plate SP, the first bit line BL1, the lower select gate transistor BST, and the upper select gate transistor TST.

The lower electrode 12 is an example of the first electrode. The upper electrode 14 is an example of the second electrode. The read electrode 16 is an example of the third electrode. The write electrode 18 is an example of the fourth electrode. The lower select gate transistor BST is an example of the second switching element. The upper select gate transistor TST is an example of the first switching element.

The organic molecular layer 10 contains a first organic molecule OM1, a second organic molecule OM2, a third organic molecule OM3, a fourth organic molecule OM4, a fifth organic molecule OM5, a sixth organic molecule OM6, a seventh organic molecule OM7, and an eighth organic molecule OM8.

The first organic molecule OM1 is an example of the first molecule. The eighth organic molecule OM8 is an example of the second molecule.

Hereinafter, the first organic molecule OM1, the second organic molecule OM2, the third organic molecule OM3, the fourth organic molecule OM4, the fifth organic molecule OM5, the sixth organic molecule OM6, the seventh organic molecule OM7, and the eighth organic molecule OM8 may be referred to individually or collectively as the organic molecule OM.

The lower select gate transistor BST includes a first semiconductor layer 24. The upper select gate transistor TST includes a second semiconductor layer 26.

The substrate insulating layer 20 is, for example, an oxide. The substrate insulating layer 20 is, for example, a silicon oxide.

The source plate SP is provided on the substrate insulating layer 20. The source plate SP is a conductor. The source plate SP is, for example, a metal or a semiconductor. The source plate SP is, for example, tungsten.

The first semiconductor layer 24 is provided between the source plate SP and the lower electrode 12. The first semiconductor layer 24 is in contact with, for example, the source plate SP and the lower electrode 12.

When the lower select gate transistor BST is ON, a channel is formed in the first semiconductor layer 24. The first semiconductor layer 24 is, for example, polycrystalline silicon.

A part of the source plate SP functions as a source/drain region of the lower select gate transistor BST. The lower electrode 12 functions as a source/drain region of the lower select gate transistor BST.

A part of the lower select gate line SBG functions as a gate electrode of the lower select gate transistor BST. A gate insulating film (not shown) is provided between a part of the lower select gate line SBG and the first semiconductor layer 24.

The lower select gate line SBG is a conductor. The lower select gate line SBG is, for example, a metal. The lower select gate line SBG is, for example, tungsten.

The lower electrode 12 is provided between the source plate SP and the organic molecular layer 10. The lower electrode 12 is provided between the first semiconductor layer 24 and the organic molecular layer 10. A dielectric layer is provided between the lower electrode 12 and the organic molecular layer 10. For example, a part of the interlayer insulating layer 22 is provided between the lower electrode 12 and the organic molecular layer 10. The lower electrode 12 and the organic molecular layer 10 are electrically separated from each other by a part of the interlayer insulating layer 22. The lower electrode 12 and the first organic molecule OM1 are electrically separated from each other by a part of the interlayer insulating layer 22.

The lower electrode 12 is a conductor. The lower electrode 12 is, for example, a metal or a semiconductor. The lower electrode 12 is, for example, tungsten.

The organic molecular layer 10 is provided between the lower electrode 12 and the upper electrode 14. The organic molecular layer 10 extends in the first direction from the lower electrode 12 toward the upper electrode 14.

The first organic molecule OM1, the second organic molecule OM2, the third organic molecule OM3, the fourth organic molecule OM4, the fifth organic molecule OM5, the sixth organic molecule OM6, the seventh organic molecule OM7, and the eighth organic molecule OM8 are stacked in the first direction.

There is no chemical bond between two organic molecules OM adjacent to each other in the first direction. For example, there is no covalent bond between two organic molecules OM adjacent to each other in the first direction.

For example, there is no chemical bond between the first organic molecule OM1 and the second organic molecule OM2 adjacent to each other in the first direction. For example, there is no covalent bond between the first organic molecule OM1 and the second organic molecule OM2.

The length of the organic molecule OM in the second direction and the third direction is, for example, equal to or more than 5 nm and equal to or less than 20 nm. The arrangement pitch of the organic molecule OM in the first direction is, for example, equal to or more than 1 nm and equal to or less than 5 nm.

The length of the organic molecule OM in the second direction and the third direction is, for example, larger than the length of the organic molecule OM in the first direction.

The organic molecule OM contains a cyclic structure. The organic molecule OM contains, for example, a fused cyclic compound. The organic molecule OM contains, for example, polycyclic aromatic hydrocarbons. The organic molecule OM contains, for example, a heterocyclic compound.

The organic molecule OM contains, for example, an alkyl group as a side chain bonded to the cyclic structure. The organic molecule OM contains, for example, three or more alkyl groups as side chains bonded to the cyclic structure. The organic molecule OM has, for example, a 3-fold or more rotational symmetry.

The organic molecule OM is, for example, a discotic liquid crystal. The organic molecule OM is, for example, a triphenylene derivative or a porphyrin derivative. The organic molecule OM contains, for example, a triphenylene skeleton or a porphyrin skeleton as a cyclic structure. The organic molecule OM is, for example, a phthalocyanine.

Figure 4:
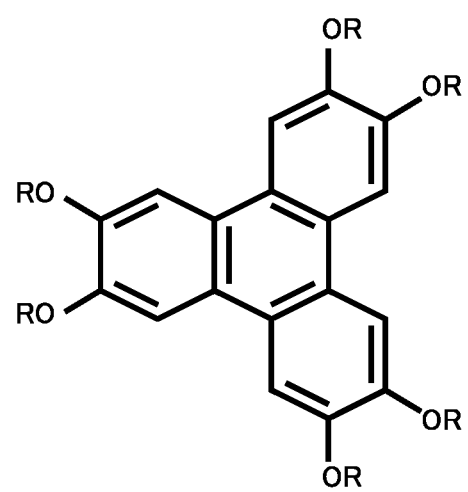
FIG. 4 is a diagram showing an example of an organic molecule according to the first embodiment.

FIG. 4 is a diagram showing an example of the organic molecule according to the first embodiment. The organic molecule in FIG. 4 is a triphenylene derivative. The organic molecule in FIG. 4 contains six alkyl groups as side chains bonded to the triphenylene skeleton. The organic molecule in FIG. 4 has a 3-fold rotational symmetry.

Figure 5A:
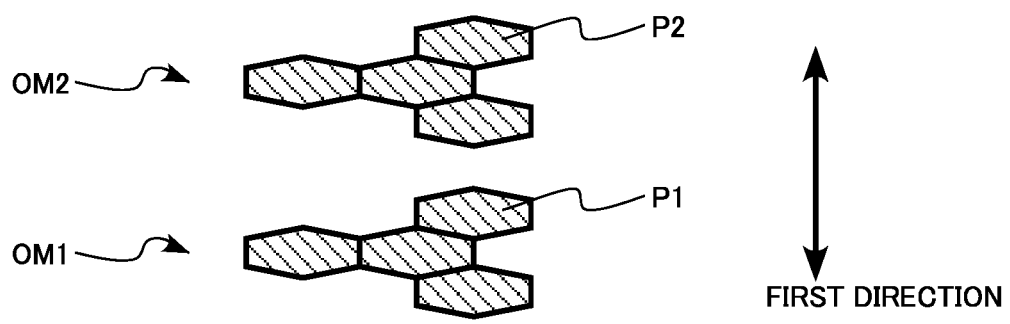
FIGS. 5A and 5B are explanatory diagrams of the organic molecule according to the first embodiment.
Figure 5B:
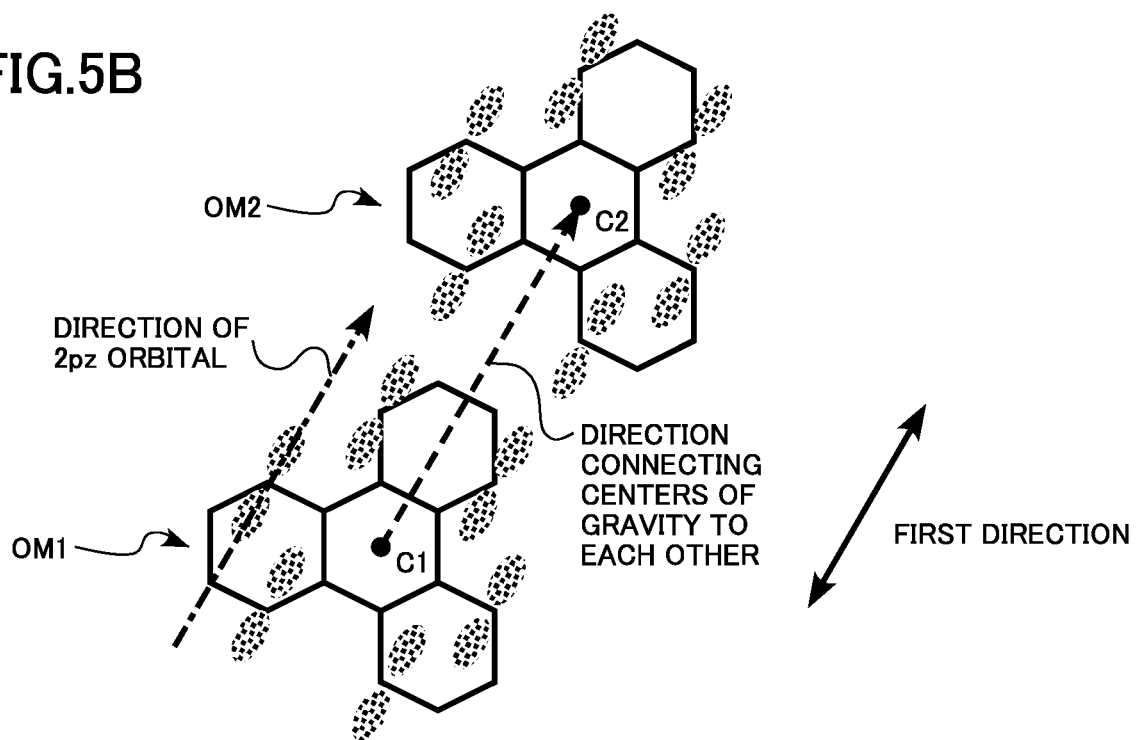

FIGS. 5A and 5B are explanatory diagrams of the organic molecule according to the first embodiment. FIGS. 5A and 5B are diagrams showing the arrangement relationship between the first organic molecule OM1 and the second organic molecule OM2 adjacent to each other in the first direction.

As shown in FIG. 5A, the first organic molecule OM1 contains a first cyclic structure in which its constituent atoms form a first face P1. The first cyclic structure is a triphenylene skeleton. The constituent atoms of the first cyclic structure are carbon (C) and hydrogen (H). In addition, the second organic molecule OM2 contains a second cyclic structure in which its constituent atoms form a second face. The second cyclic structure is a triphenylene skeleton. The constituent atoms of the second cyclic structure are carbon (C) and hydrogen (H).

As shown in FIG. 5A, the first face P1 and the second face P2 face each other in the first direction. In other words, the first face P1 and the second face P2 face each other in the stacking direction of the first organic molecule OM1 and the second organic molecule OM2.

For example, the organic molecules OM contained in the organic molecular layer 10 satisfy the arrangement relationship shown in FIG. 5A even if the organic molecules OM contained in the organic molecular layer 10 are not the organic molecules OM adjacent to each other in the first direction. For example, the first organic molecule OM1 contains a first cyclic structure in which its constituent atoms form a first face, the eighth organic molecule OM8 contains a second cyclic structure in which its constituent atoms form a second face, and the first face and the second face face each other in the first direction. In addition, in this specification, "facing" is a concept including a form in which there is another element between two elements facing each other. For example, one or more organic molecules may be present between the first face and the second face facing each other. In addition, for example, no other organic molecules may be present between the first face and the second face facing each other.

As shown in FIG. 5B, for example, the direction connecting the geometric center of gravity position (C1 in FIG. 5B) of the first organic molecule OM1 and the geometric center of gravity position (C2 in FIG. 5B) of the second organic molecule OM2 to each other matches the direction of the 2pz orbital of the first organic molecule OM1. The direction connecting the geometric center of gravity position C1 of the first organic molecule OM1 and the geometric center of gravity position C2 of the second organic molecule OM2 to each other matches, for example, the first direction.

The upper electrode 14 is provided on the organic molecular layer 10. The upper electrode 14 is provided between the organic molecular layer 10 and the first bit line BL1. The organic molecular layer 10 is provided between the lower electrode 12 and the upper electrode 14.

A part 14a of the upper electrode faces the eighth organic molecule OM8 in the third direction. The eighth organic molecule OM8 is provided between the part 14a of the upper electrode and the read electrode 16. In the third direction, the eighth organic molecule OM8 is disposed between the part 14a of the upper electrode and the read electrode 16.

The distance between the part 14a of the upper electrode and the eighth organic molecule OM8 is, for example, shorter than the length of the eighth organic molecule OM8 in the third direction. The distance between the part 14a of the upper electrode and the eighth organic molecule OM8 is, for example, shorter than the arrangement pitch of the organic molecule OM in the first direction.

The upper electrode 14 is a conductor. The upper electrode 14 is, for example, a metal or a semiconductor. The upper electrode 14 is, for example, tungsten.

The write electrode 18 faces the first organic molecule OM1 in the third direction. The distance between the write electrode 18 and the first organic molecule OM1 is, for example, shorter than the length of the first organic molecule OM1 in the third direction. The distance between the write electrode 18 and the first organic molecule OM1 is, for example, shorter than the arrangement pitch of the organic molecule OM in the first direction.

The write electrode 18 has a function of injecting a charge into the first organic molecule OM1. The write electrode 18 has, for example, a function of injecting an electron into the first organic molecule OM1.

The write electrode 18 is electrically connected to the write line WL extending in the third direction, for example, in the depth direction of the paper surface. FIG. 3 illustrates a structure in which the write electrode 18 faces the first organic molecule OM1 in the third direction. However, it is also possible to have a structure in which the write electrode 18 faces the first organic molecule OM1 in the second direction.

The write electrode 18 is a conductor. The write electrode 18 is, for example, a metal or a semiconductor. The write electrode 18 is, for example, tungsten.

The read electrode 16 faces the eighth organic molecule OM8 in the third direction. The distance between the read electrode 16 and the eighth organic molecule OM8 is, for example, shorter than the length of the eighth organic molecule OM8 in the third direction. The distance between the read electrode 16 and the eighth organic molecule OM8 is, for example, shorter than the arrangement pitch of the organic molecule OM in the first direction.

The read electrode 16 has a function of allowing a current to flow through the eighth organic molecule OM8. A current flows through the eighth organic molecule OM8 with the read electrode 16 as one terminal and the upper electrode 14 as the other terminal.

The read electrode 16 extends, for example, in the depth direction of the paper surface, that is, in the second direction.

The read electrode 16 is a conductor. The read electrode 16 is, for example, a metal or a semiconductor. The read electrode 16 is, for example, tungsten.

The upper select gate transistor TST includes the second semiconductor layer 26. The second semiconductor layer 26 is provided between the upper electrode 14 and the first bit line BL1. The second semiconductor layer 26 is in contact with, for example, the upper electrode 14 and the first bit line BL1.

When the upper select gate transistor TST is ON, a channel is formed in the second semiconductor layer 26. The second semiconductor layer 26 is, for example, polycrystalline silicon.

The upper electrode 14 functions as a source/drain region of the upper select gate transistor TST. A part of the first bit line BL1 functions as a source/drain region of the upper select gate transistor TST.

A part of the upper select gate line STG functions as a gate electrode of the upper select gate transistor TST. A gate insulating film (not shown) is provided between a part of the upper select gate line STG and the second semiconductor layer 26.

The upper select gate line STG is a conductor. The upper select gate line STG is, for example, a metal. The upper select gate line STG is, for example, tungsten.

The first bit line BL1 is a conductor. The first bit line BL1 is, for example, a metal. The first bit line BL1 is, for example, tungsten.

The interlayer insulating layer 22 is, for example, an oxide. The interlayer insulating layer 22 is, for example, a silicon oxide.

Next, an example of a method for manufacturing the organic molecular memory according to the first embodiment will be described. Hereinafter, an example of a method for manufacturing the memory cell array 101 of the organic molecular memory 100 will be described.

FIGS. 6 to 13 are schematic cross-sectional views showing an example of a method for manufacturing the organic molecular memory according to the first embodiment. FIGS. 6 to 13 show cross sections corresponding to FIG. 3.

First, for example, the substrate insulating layer 20 is formed on a semiconductor substrate (not shown) by using a known process technique. The substrate insulating layer 20 is, for example, a silicon oxide layer. The silicon oxide layer is formed by using, for example, a chemical vapor deposition method (CVD method).

Figure 6:
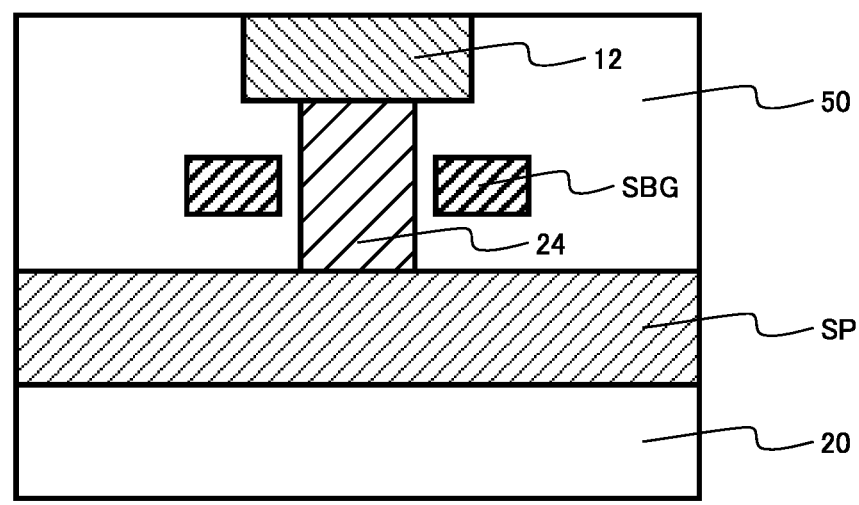
FIG. 6 is a schematic cross-sectional view showing an example of a method for manufacturing the organic molecular memory according to the first embodiment.

Then, the source plate SP, a first silicon oxide layer 50, the lower select gate line SBG, the first semiconductor layer 24, and the lower electrode 12 are formed on the substrate insulating layer 20 by using a known process technique (FIG. 6). The source plate SP, the lower select gate line SBG, and the lower electrode 12 are formed of, for example, tungsten. The first semiconductor layer 24 is formed of, for example, polycrystalline silicon.

Figure 7:
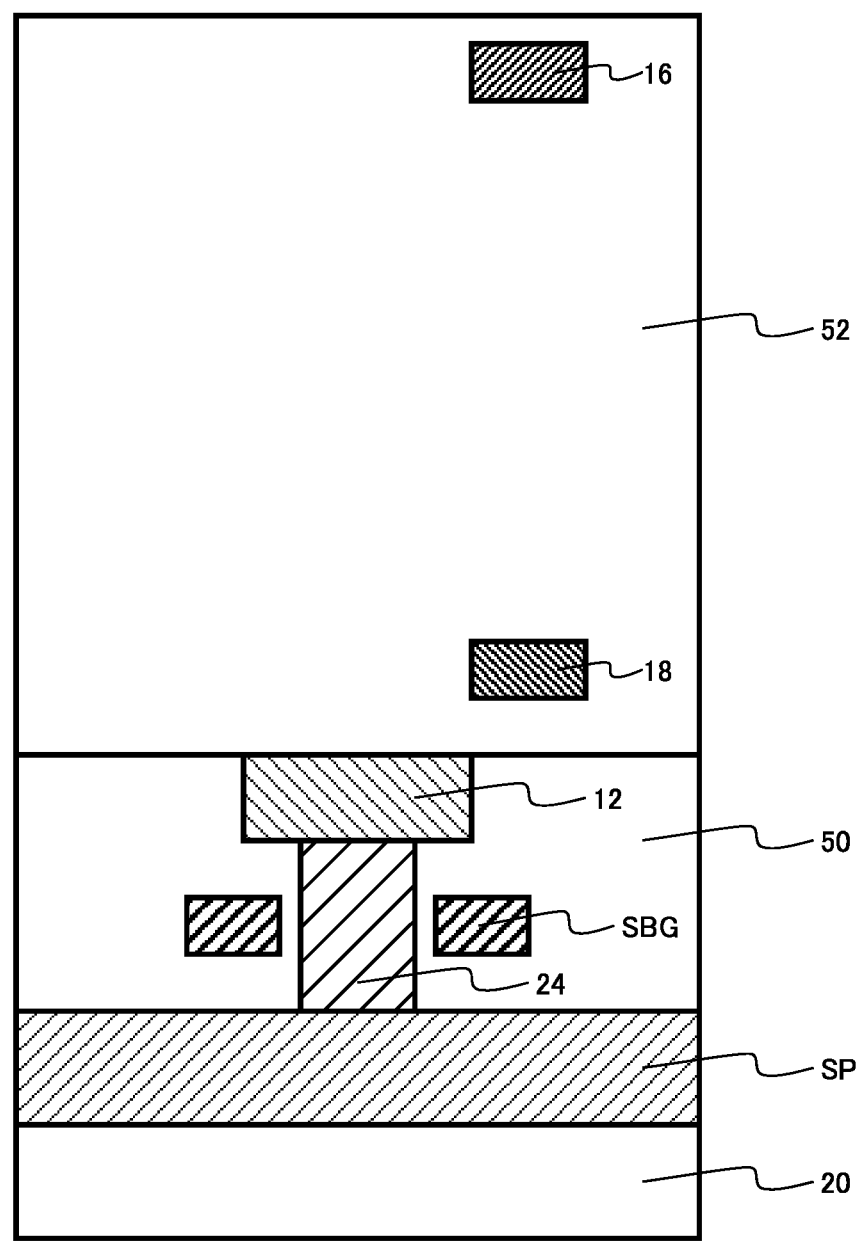
FIG. 7 is a schematic cross-sectional view showing an example of the method for manufacturing the organic molecular memory according to the first embodiment.

Then, a second silicon oxide layer 52, the write electrode 18, and the read electrode 16 are formed on the lower electrode 12 and the first silicon oxide layer 50 by using a known process technique (FIG. 7). The write electrode 18 and the read electrode 16 are formed of, for example, tungsten.

Figure 8:
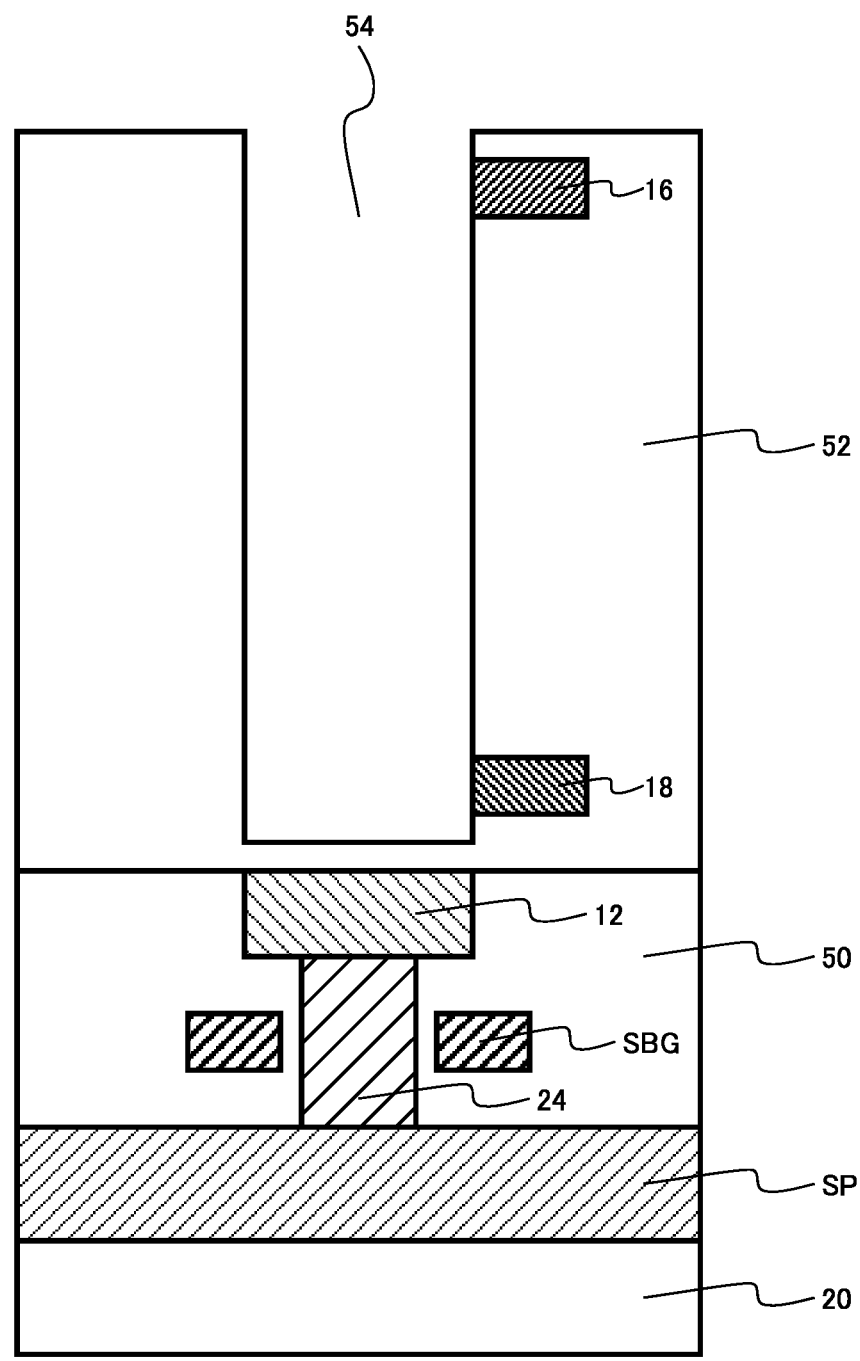
FIG. 8 is a schematic cross-sectional view showing an example of the method for manufacturing the organic molecular memory according to the first embodiment.

Then, an opening 54 is formed in the second silicon oxide layer 52 (FIG. 8). The opening 54 is formed by, for example, a lithography method and a reactive ion etching method (RIE method). For example, a part of the second silicon oxide layer 52 remains at the bottom of the opening 54.

Figure 9:
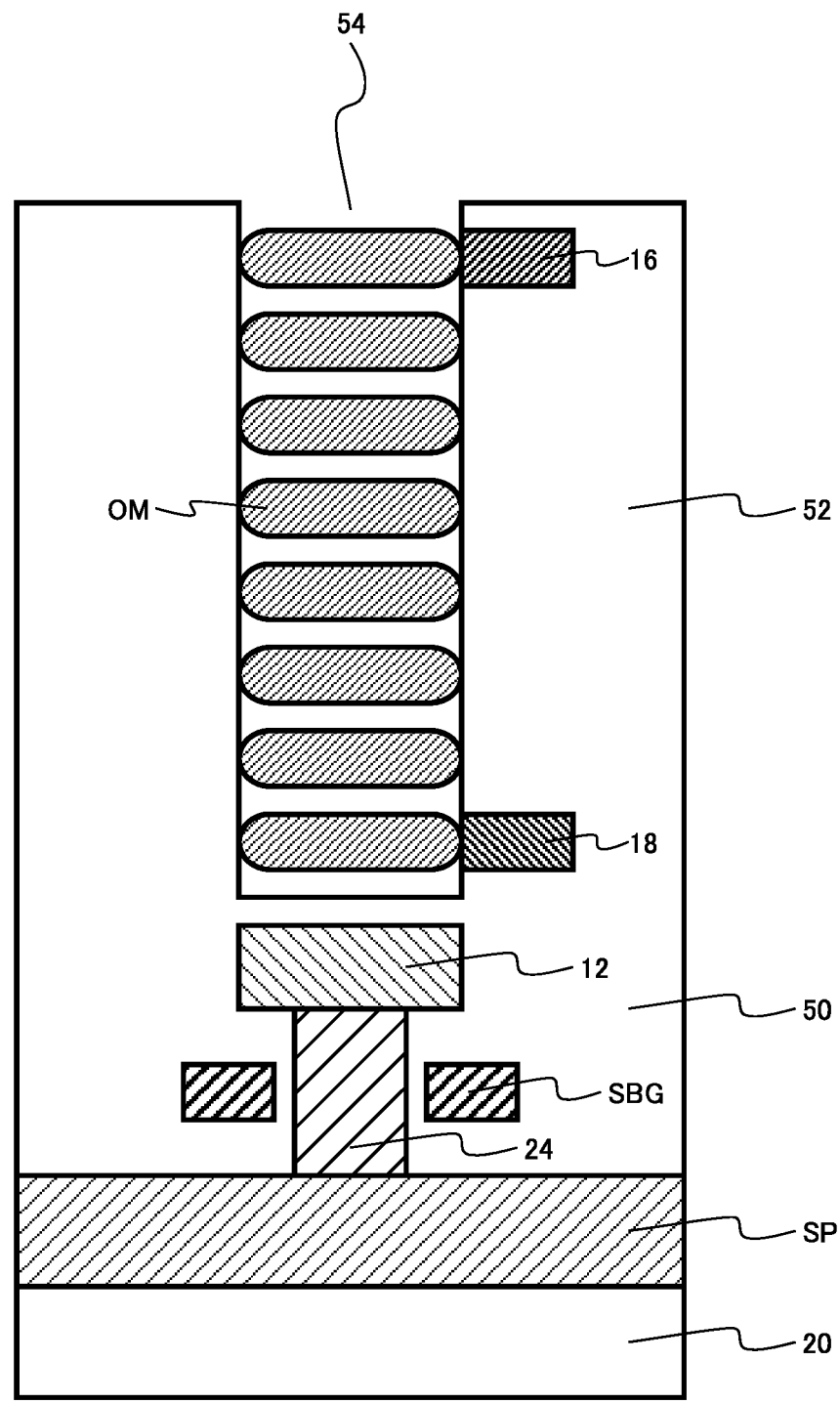
FIG. 9 is a schematic cross-sectional view showing an example of the method for manufacturing the organic molecular memory according to the first embodiment.

Then, a plurality of organic molecules OM are stacked in the opening 54 (FIG. 9). The plurality of organic molecules OM are formed, for example, by a vapor deposition method. The organic molecule OM is, for example, a discotic liquid crystal. The plurality of organic molecules OM are arranged in the opening 54 in a self-aligned manner in the first direction.

Figure 10:
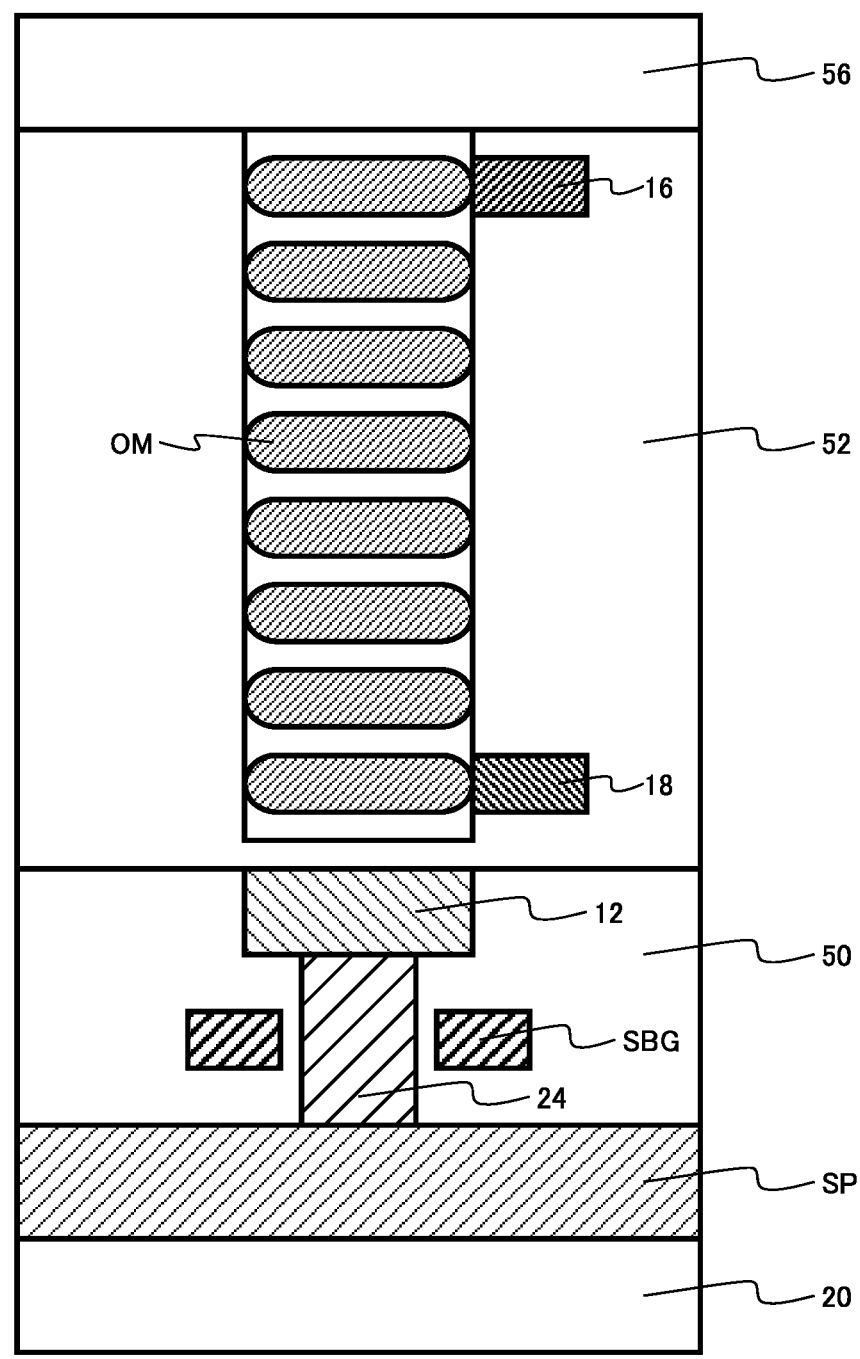
FIG. 10 is a schematic cross-sectional view showing an example of the method for manufacturing the organic molecular memory according to the first embodiment.

Then, a third silicon oxide layer 56 is formed on the second silicon oxide layer 52 (FIG. 10). The third silicon oxide layer 56 is formed, for example, by a CVD method.

Figure 11:
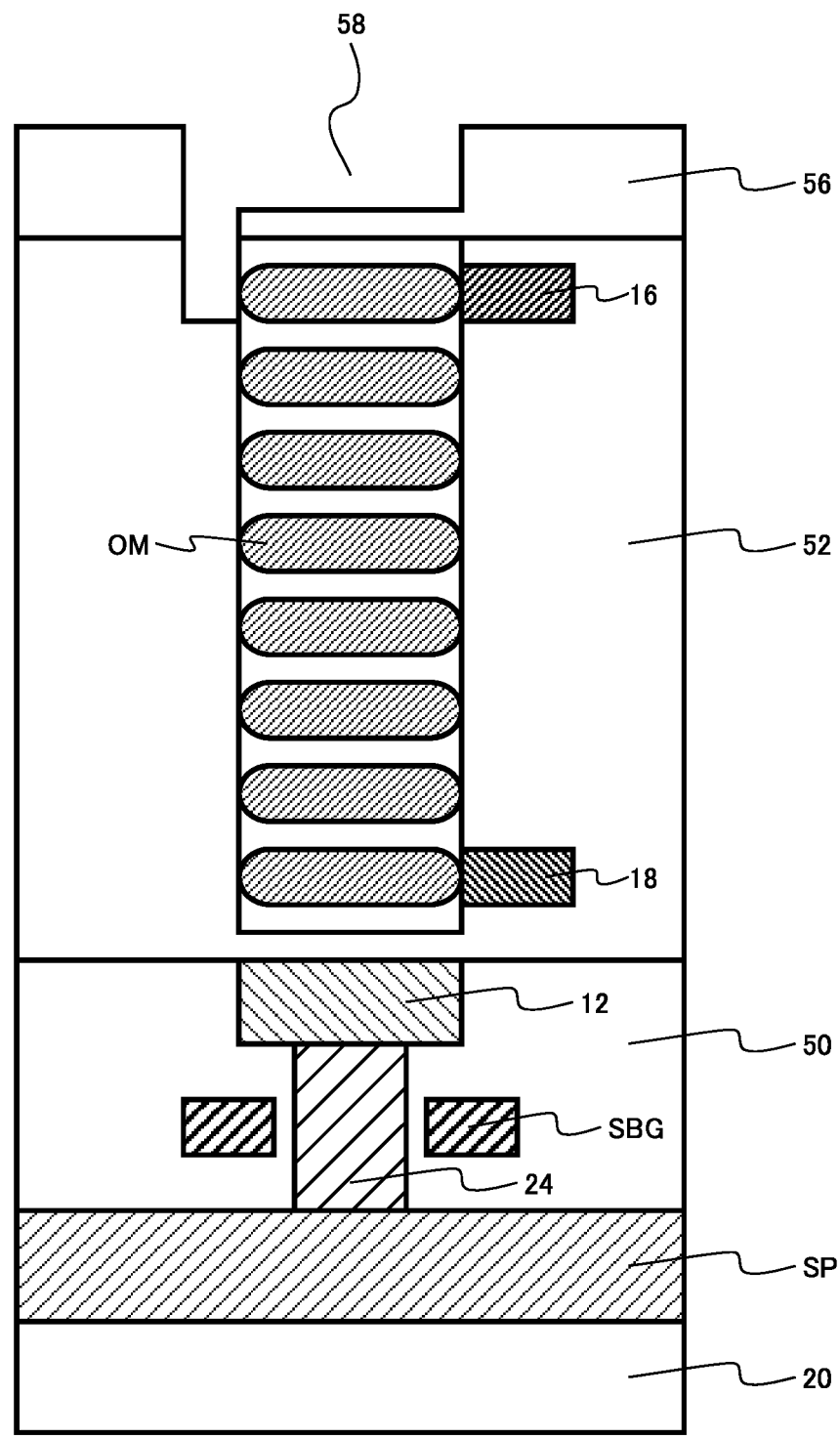
FIG. 11 is a schematic cross-sectional view showing an example of the method for manufacturing the organic molecular memory according to the first embodiment.

Then, a groove 58 is formed in the third silicon oxide layer 56 (FIG. 11). The groove 58 is formed by, for example, a lithography method and a RIE method.

Figure 12:
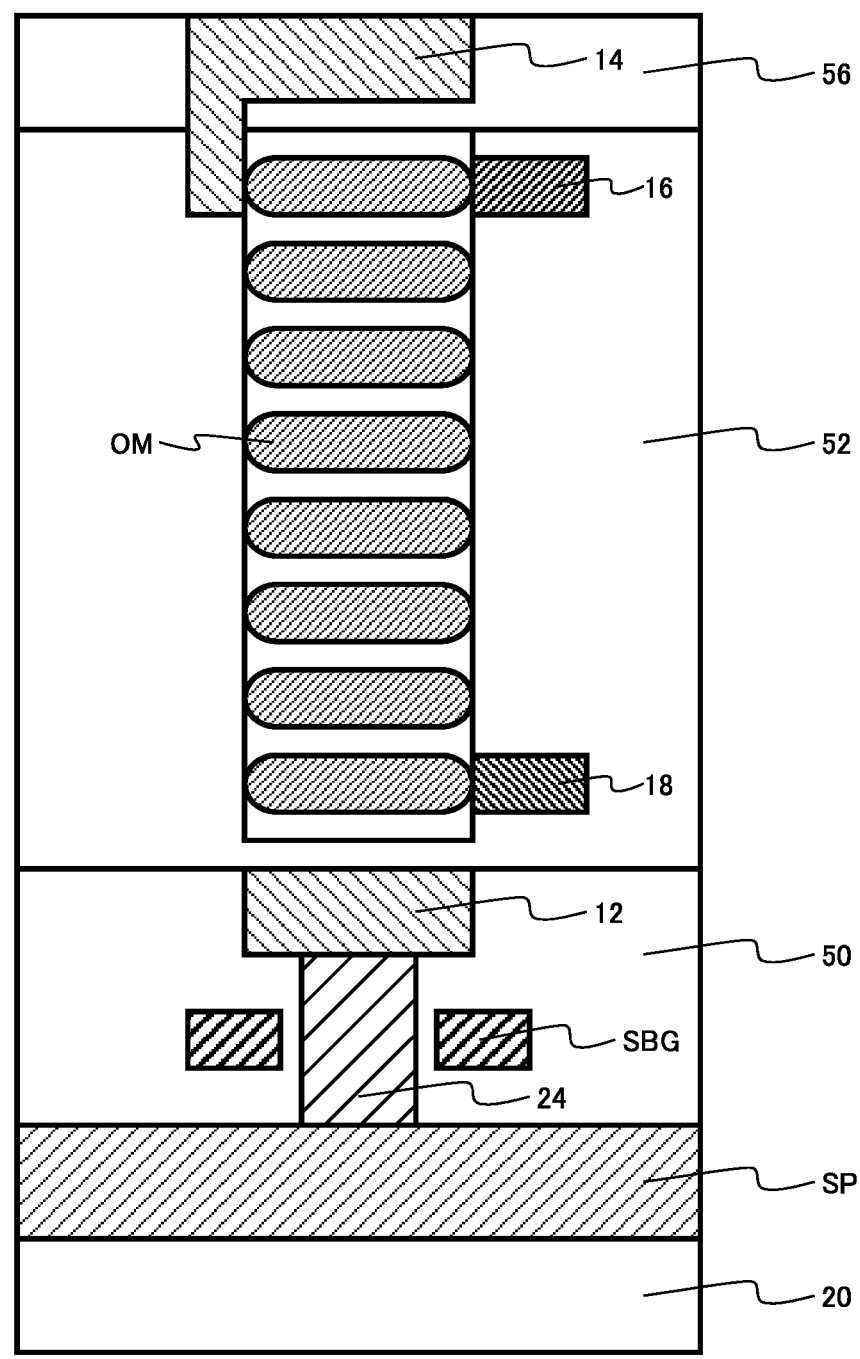
FIG. 12 is a schematic cross-sectional view showing an example of the method for manufacturing the organic molecular memory according to the first embodiment.

Then, the upper electrode 14 is formed in the groove 58 (FIG. 12). The upper electrode 14 is, for example, tungsten. The upper electrode 14 is formed by using, for example, a CVD method and a chemical mechanical polishing method (CMP method).

Figure 13:
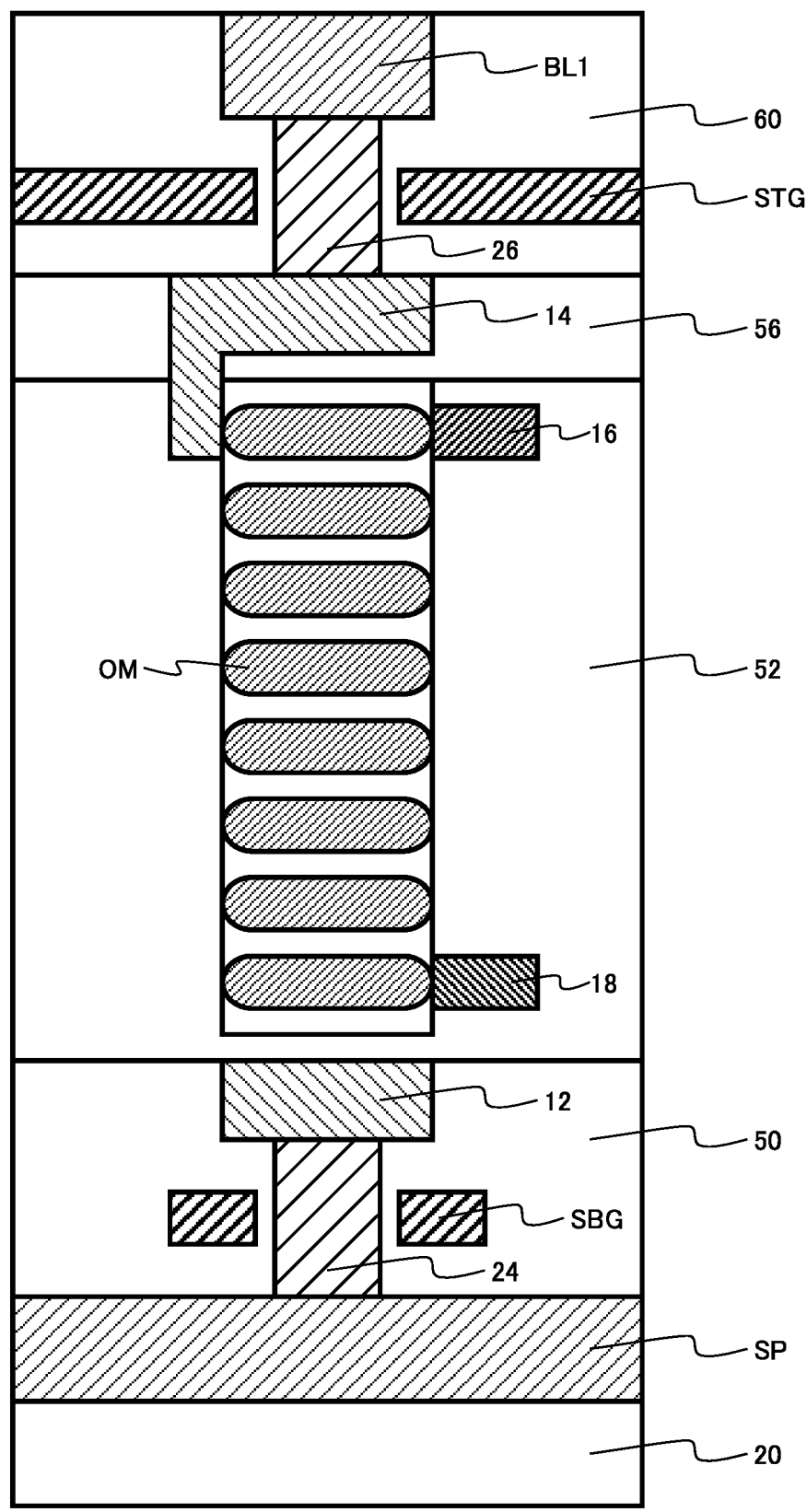
FIG. 13 is a schematic cross-sectional view showing an example of the method for manufacturing the organic molecular memory according to the first embodiment.

Then, a fourth silicon oxide layer 60, the upper select gate line STG, the second semiconductor layer 26, and the first bit line BL1 are formed on the upper electrode 14 and the third silicon oxide layer 56 by using a known process technique (FIG. 13).

By the manufacturing method described above, the memory cell array 101 of the organic molecular memory 100 according to the first embodiment shown in FIG. 3 is manufactured.

Next, the operation of the organic molecular memory 100 will be described.

In the organic molecular memory 100, during a write operation and a read operation, the data stored in the plurality of organic molecules OM stacked in the organic molecular layer 10 is sequentially transferred to the adjacent organic molecules OM. The organic molecular memory 100 performs a so-called shift register type operation during the write operation and the read operation.

FIGS. 14 to 21 are explanatory diagrams of the operation of the organic molecular memory according to the first embodiment.

Figure 14:
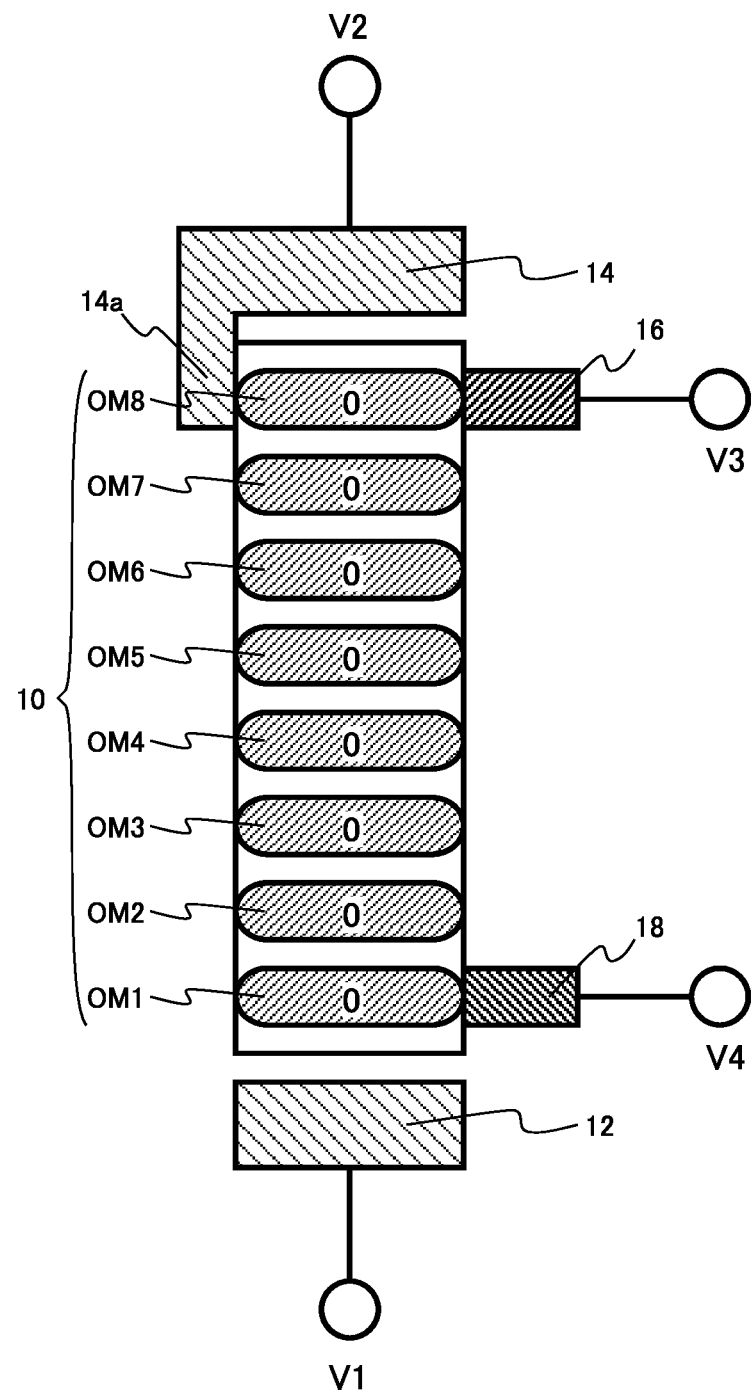
FIG. 14 is an explanatory diagram of the operation of the organic molecular memory according to the first embodiment.

FIG. 14 shows the initial state of the operation of the organic molecular memory 100. In the operation of the organic molecular memory 100, a first voltage V1 is applied to the lower electrode 12, a second voltage V2 is applied to the upper electrode 14, a third voltage V3 is applied to the read electrode 16, and a fourth voltage V4 is applied to the write electrode 18.

The state in which no electron is written to the organic molecule OM is defined as data 0. In addition, the state in which an electron is written into the organic molecule OM is defined as data 1.

As shown in FIG. 14, as an initial state of the operation of the organic molecular memory 100, a case where the data stored in all the organic molecules OM is data 0 is considered.

Figure 15:
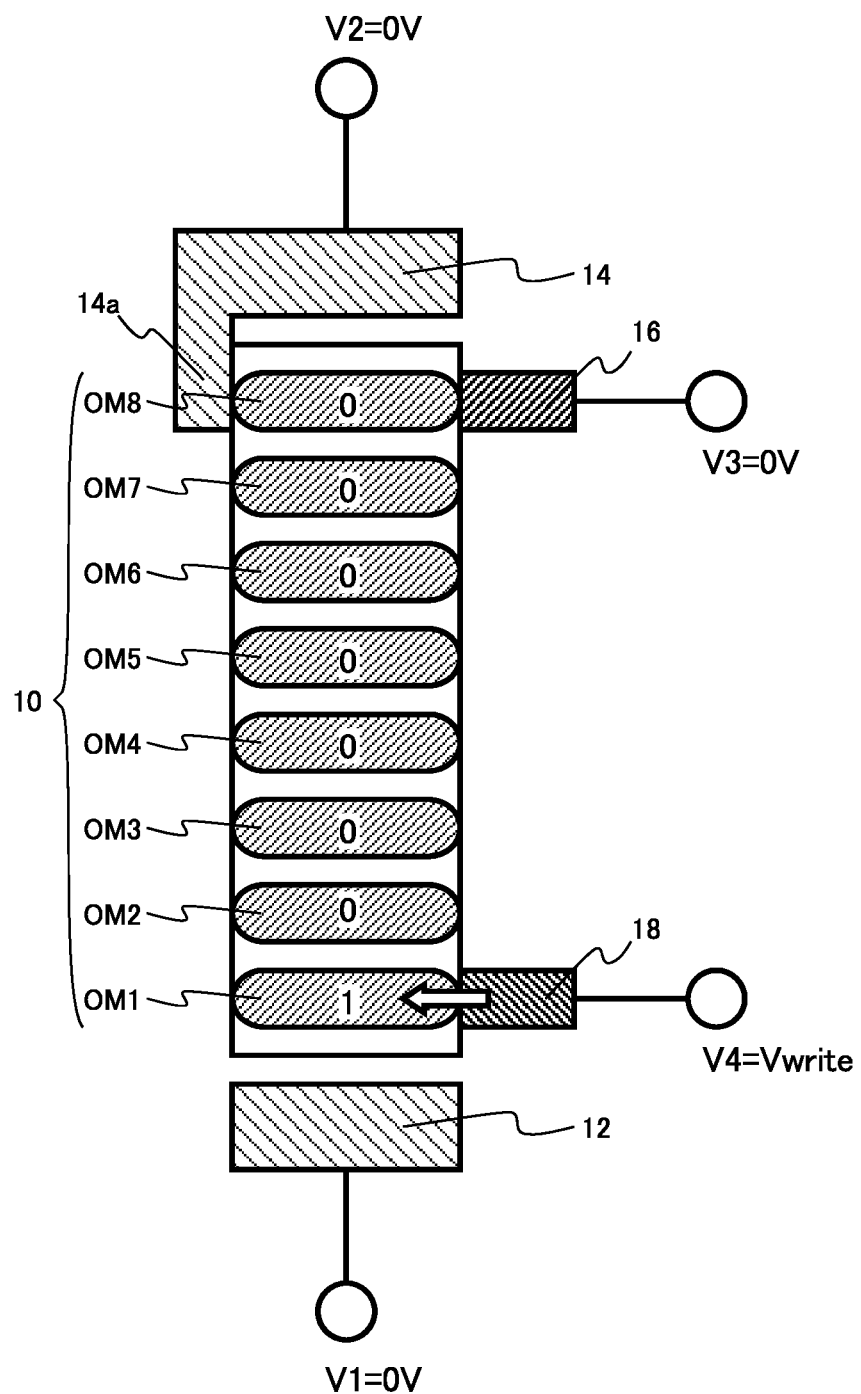
FIG. 15 is an explanatory diagram of the operation of the organic molecular memory according to the first embodiment.

First, as shown in FIG. 15, data 1 is written to the first organic molecule OM1, for example. When writing the data 1 to the first organic molecule OM1, the fourth voltage V4 is set to a voltage lower than the first voltage V1. When writing the data 1 to the first organic molecule OM1, for example, the first voltage V1 is set to 0 V and the fourth voltage V4 is set to a write voltage Vwrite. The write voltage Vwrite is a negative voltage.

Electrons are injected from the write electrode 18 into the first organic molecule OM1, so that the data 1 is written to the first organic molecule OM1. In other words, the data 1 is written by reducing the first organic molecule OM1.

The organic molecular memory 100 controls the data stored in the organic molecule OM by injecting an electron into the organic molecule OM or extracting an electron from the organic molecule OM. In other words, the organic molecular memory 100 controls the data stored in the organic molecule OM by using the redox reaction of the organic molecule OM.

In addition, when writing the data 1 to the first organic molecule OM1, for example, the second voltage V2 is 0 V and the third voltage V3 is 0 V.

Figure 16:
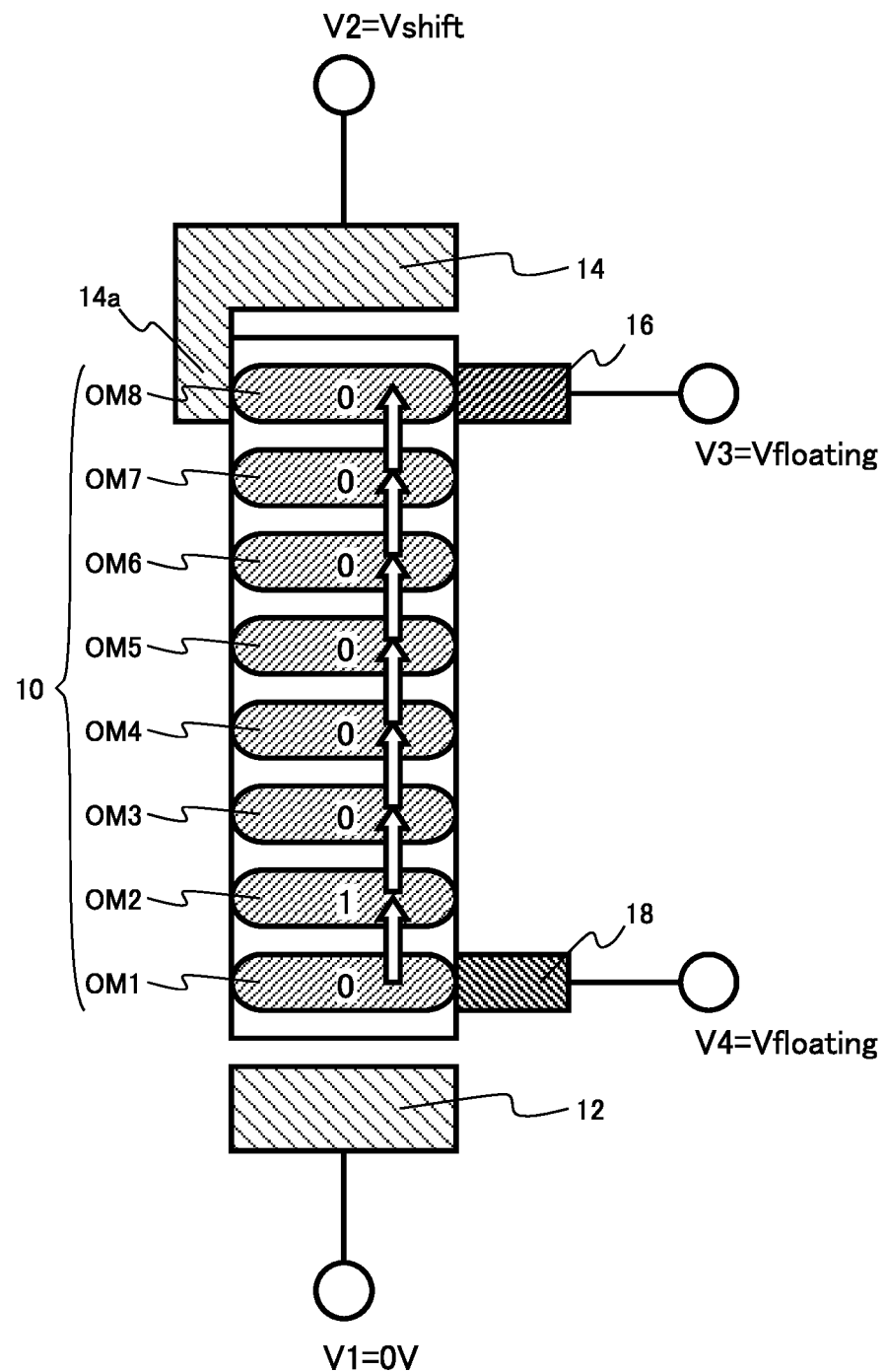
FIG. 16 is an explanatory diagram of the operation of the organic molecular memory according to the first embodiment.

After writing the data 1 to the first organic molecule OM1, the data of the organic molecule OM is transferred in a direction from the lower electrode 12 toward the upper electrode 14 as shown in FIG. 16. When transferring the data of the organic molecule OM, for example, the first voltage V1 is set to 0 V and the second voltage V2 is set to a shift voltage Vshift. The shift voltage Vshift is a positive voltage. The shift voltage Vshift is applied, for example, as a pulse. When transferring the data of the organic molecule OM, for example, a tunneling current flows through a part of the interlayer insulating layer 22 between the lower electrode 12 and the first organic molecule OM1.

When transferring the data of the organic molecule OM, for example, the read electrode 16 and the write electrode 18 have a floating electric potential. Hereinafter, for convenience of explanation, the state in which the read electrode 16 and the write electrode 18 have a floating electric potential is expressed as "each of the third voltage V3 and the fourth voltage V4 is a floating voltage Vfloating".

Figure 17:
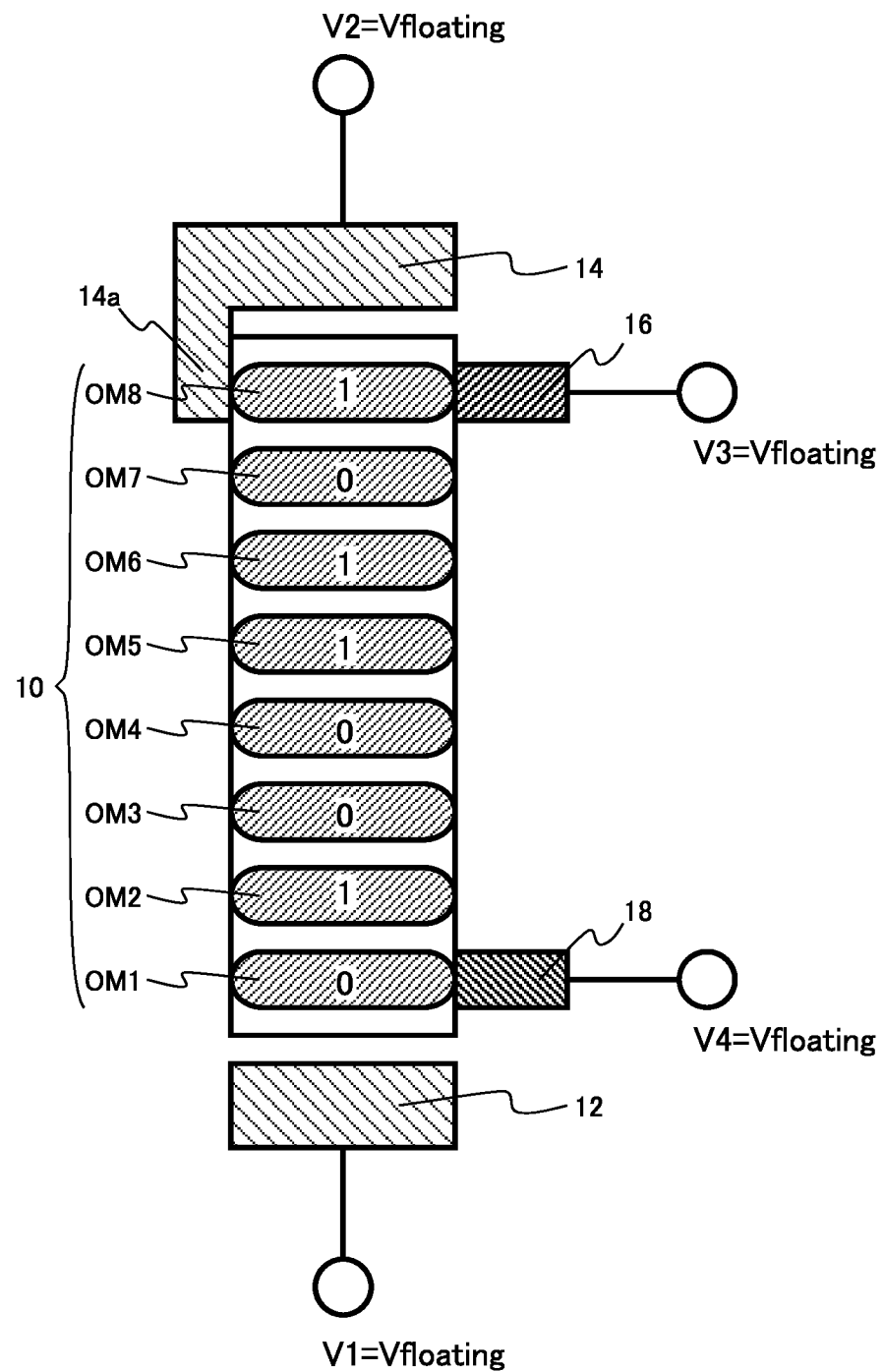
FIG. 17 is an explanatory diagram of the operation of the organic molecular memory according to the first embodiment.

By repeating the writing of the data to the first organic molecule OM1 and the transfer of the data of the organic molecule OM, for example, as shown in FIG. 17, data 0 or data 1 is stored in all the organic molecules OM. For example, by maintaining the first voltage V1, the second voltage V2, the third voltage V3, and the fourth voltage V4 at the floating voltage Vfloating, the data stored in the organic molecule OM is held. In other words, the organic molecular memory 100 functions as a non-volatile memory capable of holding data even when a power supply voltage is not applied.

Figure 18:
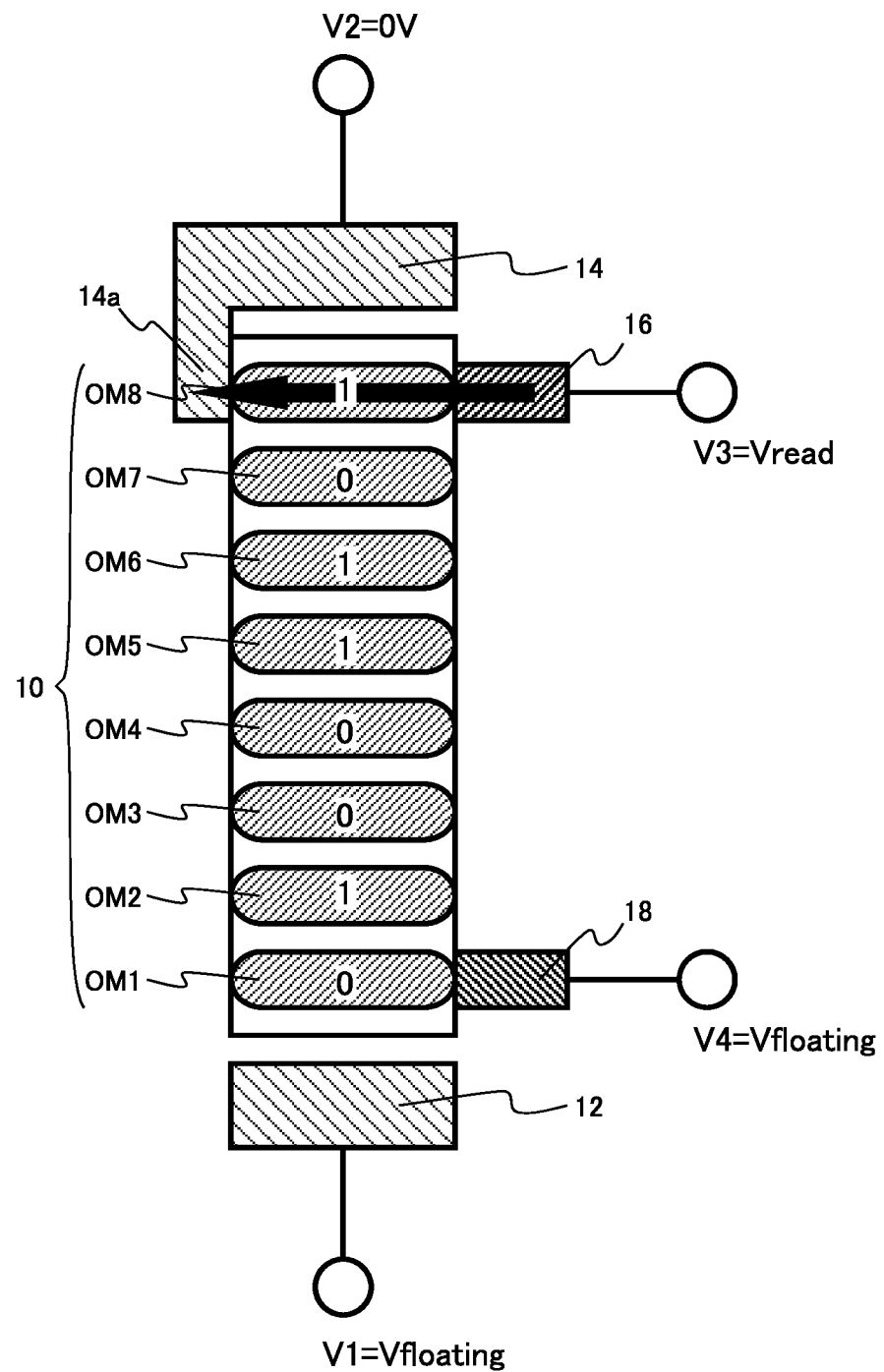
FIG. 18 is an explanatory diagram of the operation of the organic molecular memory according to the first embodiment.

Then, as shown in FIG. 18, the data of the eighth organic molecule OM8 is read. When reading the data of the eighth organic molecule OM8, for example, the second voltage is set to 0 V and the third voltage is set to a read voltage Vread. The read voltage Vread is, for example, a positive voltage. The absolute value of the read voltage Vread is, for example, lower than the absolute value of the write voltage Vwrite.

A current flows from the read electrode 16 to the part 14a of the upper electrode through the eighth organic molecule OM8. The magnitude of the current flowing through the eighth organic molecule OM8 changes depending on the data stored in the eighth organic molecule OM8. For example, when the data stored in the eighth organic molecule OM8 is data 1, a large current flows as compared with a case where the data stored in the eighth organic molecule OM8 is data 0. This is because the conductance of the eighth organic molecule OM8 changes due to the injection of an electron into the eighth organic molecule OM8.

The current flowing from the read electrode 16 to the upper electrode 14 flows to the first bit line BL1 through, for example, the upper select gate transistor TST turned on. The data of the eighth organic molecule OM8 is read based on the current flowing through the first bit line BL1.

The organic molecular memory 100 reads the data stored in the organic molecule OM by detecting the current flowing from the read electrode 16 to the upper electrode 14. The current flowing from the read electrode 16 to the upper electrode 14 is a tunneling current based on the wave function of the organic molecule OM.

In addition, when reading the data of the eighth organic molecule OM8, for example, the first voltage V1 and the fourth voltage V4 are the floating voltage Vfloating.

Figure 19:
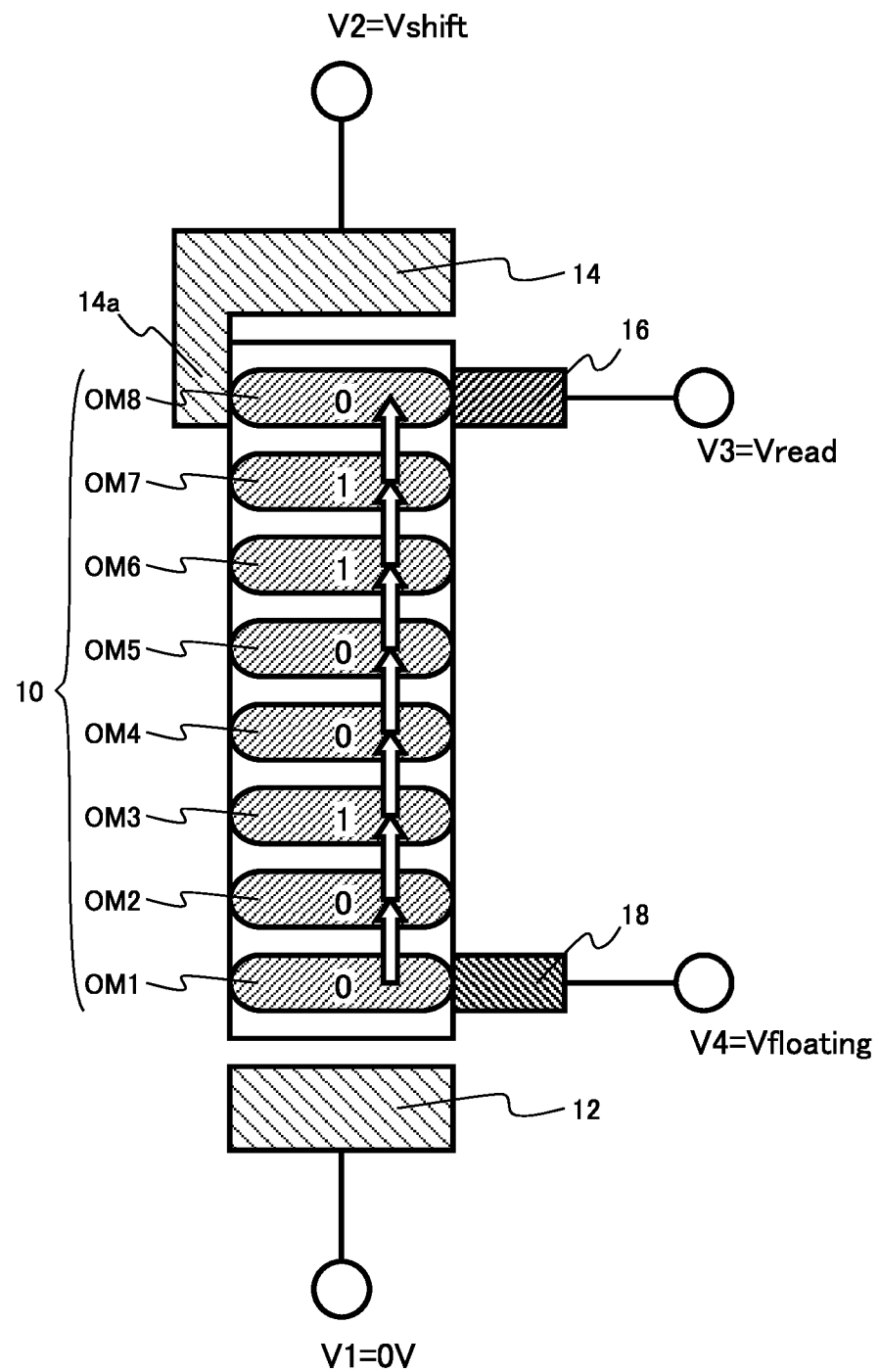
FIG. 19 is an explanatory diagram of the operation of the organic molecular memory according to the first embodiment.

After reading the data of the eighth organic molecule OM8, the data of the organic molecule OM is transferred in a direction from the lower electrode 12 toward the upper electrode 14 as shown in FIG. 19. When transferring the data of the organic molecule OM, for example, the first voltage V1 is set to 0 V and the second voltage V2 is set to a shift voltage Vshift. The shift voltage Vshift is a positive voltage. The shift voltage Vshift is applied, for example, as a pulse. The third voltage V3 and the fourth voltage V4 are the floating voltage Vfloating.

In addition, for example, the data of the eighth organic molecule OM8 may be erased before the data of the organic molecule OM is transferred. For example, when erasing the data of the eighth organic molecule OM8, the second voltage V2 and the third voltage V3 are set as positive voltages. By setting the second voltage V2 and the third voltage V3 as positive voltages, for example, even if the data 1 is stored in the eighth organic molecule OM8, an electron can be extracted from the eighth organic molecule OM8. As a result, it is possible to reset the data of the eighth organic molecule OM8 to data 0.

Figure 20:
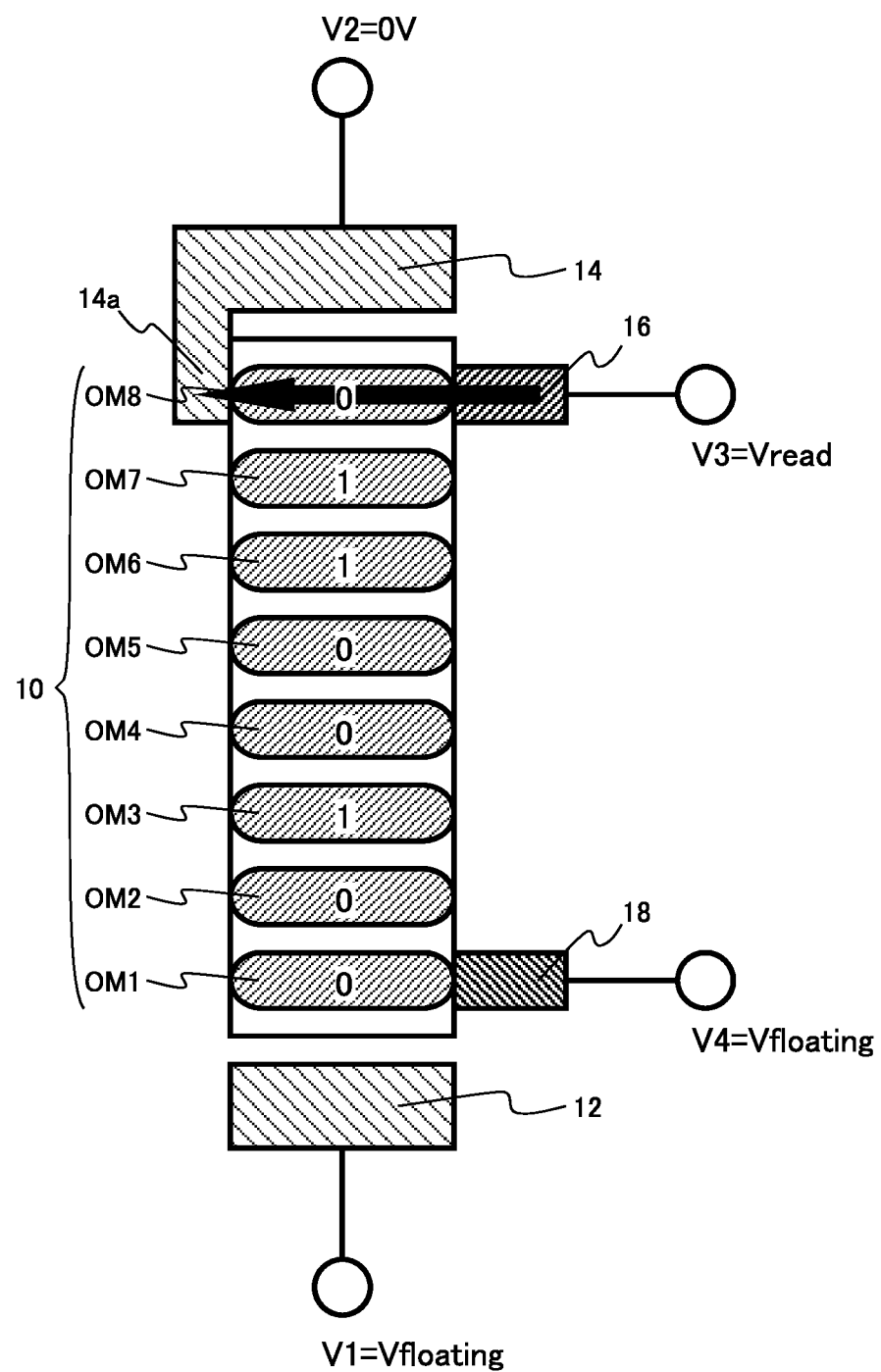
FIG. 20 is an explanatory diagram of the operation of the organic molecular memory according to the first embodiment.

Then, as shown in FIG. 20, the data of the eighth organic molecule OM8 is read. The data of the eighth organic molecule OM8 is the data stored in the seventh organic molecule OM7 before the data transfer. When reading the data of the eighth organic molecule OM8, for example, the second voltage is set to 0 V and the third voltage is set to a read voltage Vread. The first voltage V1 and the fourth voltage V4 are, for example, the floating voltage Vfloating.

Figure 21:
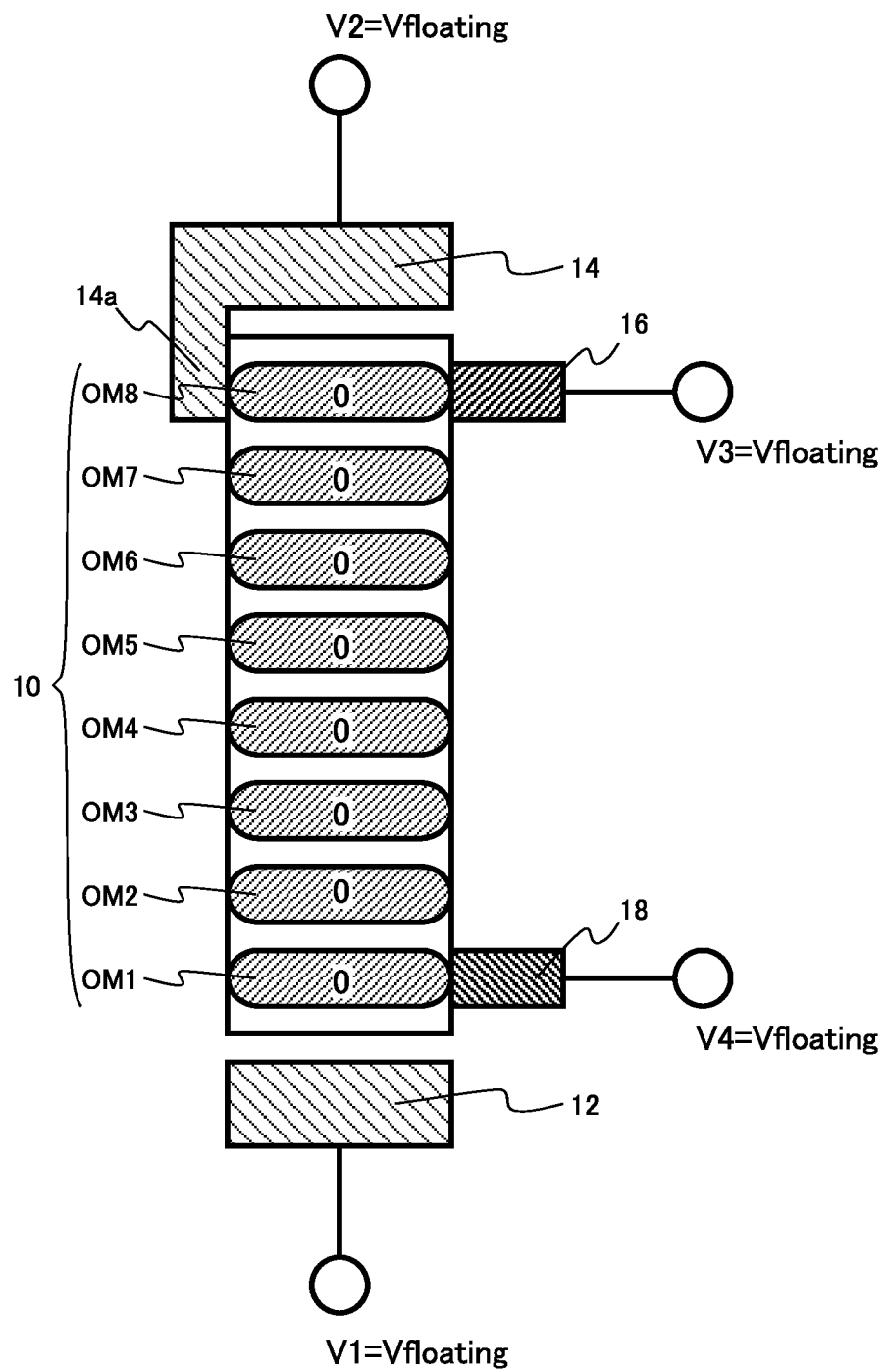
FIG. 21 is an explanatory diagram of the operation of the organic molecular memory according to the first embodiment.

By repeating the reading of the data of the eighth organic molecule OM8 and the transfer of the data of the organic molecule OM, it is possible to read the data stored in all the organic molecules OM of the organic molecular layer 10. After reading the data stored in all the organic molecules OM, the organic molecular layer 10 returns to the initial state as shown in FIG. 21.

Figure 22:
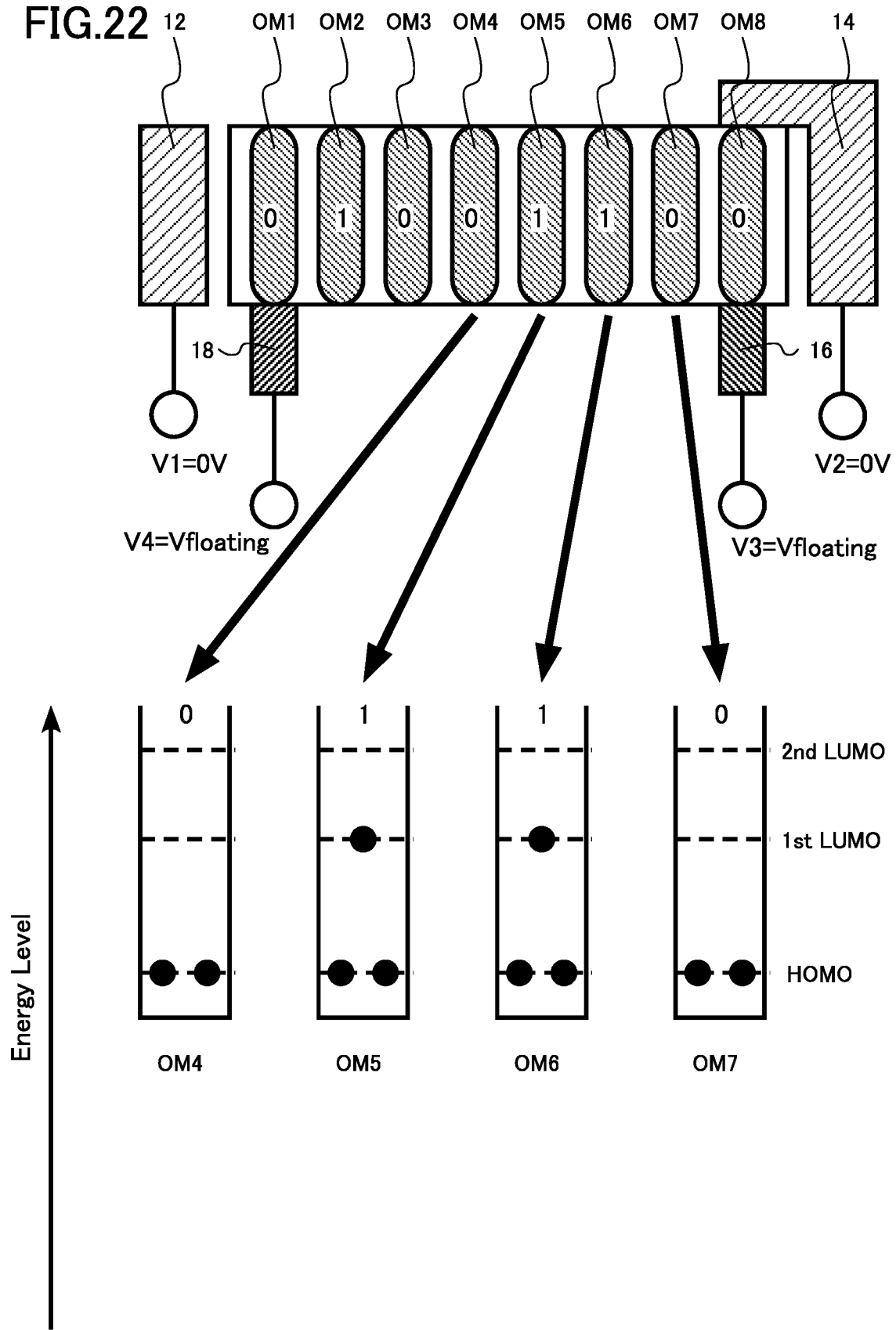
FIG. 22 is an explanatory diagram of the mechanism of the data transfer operation of the organic molecular memory according to the first embodiment.
Figure 23:
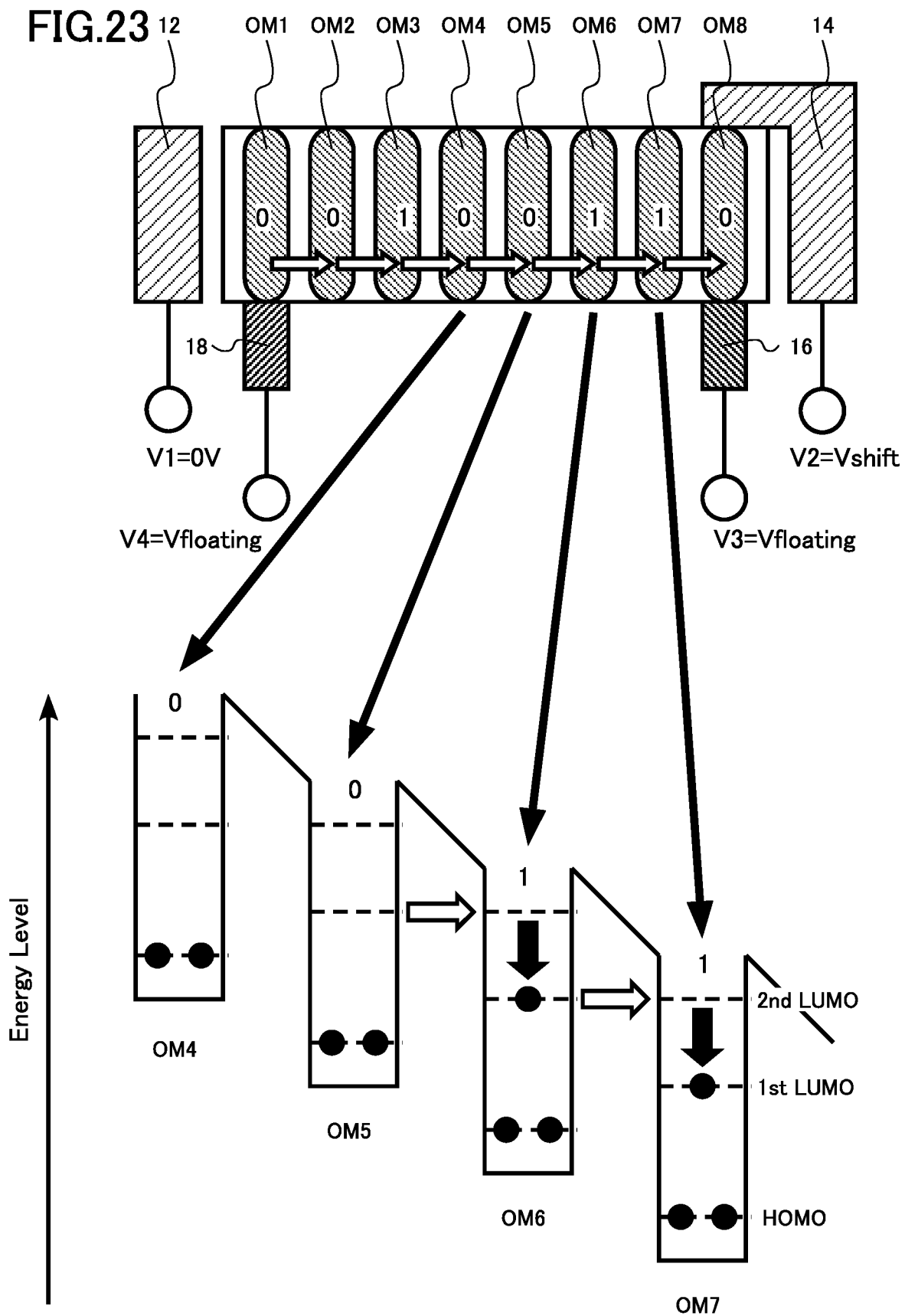
FIG. 23 is an explanatory diagram of the mechanism of the data transfer operation of the organic molecular memory according to the first embodiment.

Next, the mechanism of the data transfer operation of the organic molecular memory according to the first embodiment will be described. FIGS. 22 and 23 are explanatory diagrams of the mechanism of the data transfer operation of the organic molecular memory according to the first embodiment.

FIG. 22 is a diagram showing the state of the organic molecular layer 10 before data transfer. FIG. 23 is a diagram showing a state during data transfer.

The upper parts of FIGS. 22 and 23 are diagrams showing the data state of the organic molecular layer 10 and the voltage applied to each electrode. In addition, the lower parts of FIGS. 22 and 23 are band diagrams of the fourth organic molecule OM4, the fifth organic molecule OM5, the sixth organic molecule OM6, and the seventh organic molecule OM7. The vertical axis in the lower parts of FIGS. 22 and 23 indicates the energy level of the electron. In addition, in the lower parts of FIGS. 22 and 23, the black circle indicates one electron.

As shown in the upper part of FIG. 22, in a state before data transfer, data 0 is stored in the fourth organic molecule OM4, data 1 is stored in the fifth organic molecule OM5, data 1 is stored in the sixth organic molecule OM6, data 0 is stored in the seventh organic molecule OM7.

As shown in the lower part of FIG. 22, each organic molecule OM of the fourth organic molecule OM4, the fifth organic molecule OM5, the sixth organic molecule OM6, and the seventh organic molecule OM7 has a highest occupied molecular orbital level (HOMO level), a first lowest unoccupied molecular orbital level (first LUMO level), and a second lowest unoccupied molecular orbital level (second LUMO level) as electron energy levels.

In a state in which the data 1 is stored in the organic molecule OM, one electron is present at the first LUMO level. In addition, in a state in which the data 0 is stored in the organic molecule OM, no electron is present at the first LUMO level.

As shown in the upper part of FIG. 23, the shift voltage Vshift is applied to the upper electrode 14 as the second voltage V2 during data transfer. As shown in the lower part of FIG. 23, the shift voltage Vshift is set to a voltage at which the energy levels of the first LUMO level and the second LUMO level match between the adjacent organic molecules OM.

When the energy levels of the first LUMO level and the second LUMO level match between the adjacent organic molecules OM, an electron present at the first LUMO level can be moved to the second LUMO level of the adjacent organic molecule OM due to the tunneling phenomenon. The electron that has moved to the second LUMO level moves to the first LUMO level to stabilize after a predetermined period of time. In other words, the electron that has moved from the first LUMO level to the second LUMO level of the adjacent organic molecule OM moves to the first LUMO level to stabilize by dissipating energy from the excited state.

For example, when the shift voltage Vshift is applied to the upper electrode 14 as the second voltage V2, the electron present at the first LUMO level of the fifth organic molecule OM5 moves to the second LUMO level of the sixth organic molecule OM6 due to the tunneling phenomenon. After a predetermined period of time, the electron moves to the first LUMO level of the sixth organic molecule OM6 to stabilize.

By the mechanism described above, the data stored in the organic molecule OM is transferred to the adjacent organic molecule OM. By applying the shift voltage Vshift as a pulse, the data can be sequentially transferred.

Next, the function and effect of the organic molecular memory of the first embodiment will be described.

It is desired to realize a large data capacity and a low cost of the non-volatile memory. The organic molecular memory 100 according to the first embodiment uses an organic molecule in a memory cell. By using a minute organic molecule in the memory cell, the memory cell can be scaled-down. In addition, a plurality of organic molecules OM are arranged in a self-aligned manner in one direction to form the memory cell array 101 having a three-dimensional structure. In addition, by arranging the organic molecules OM in one direction to perform a shift register type operation, for example, a control electrode for controlling each memory cell is not required. By adopting the configuration described above, the organic molecular memory 100 according to the first embodiment can realize a large data capacity and a low cost of the organic molecular memory.

The organic molecule OM preferably contains, for example, an alkyl group as a side chain bonded to the cyclic structure. By containing the alkyl group as a side chain, it becomes easy to arrange the faces formed by the atoms of the cyclic structures of the plurality of organic molecules OM in a self-aligned manner so as to face each other in the first direction.

It is preferable that the direction connecting the geometric center of gravity positions of the stacked organic molecules OM to each other matches the direction of the 2pz orbitals of the organic molecules. With the configuration described above, it becomes easy to transfer the data of the organic molecule OM.

The organic molecule OM preferably has a 3-fold or more rotational symmetry, more preferably a 4-fold or more rotational symmetry, and even more preferably a 6-fold or more rotational symmetry. The high symmetry of the organic molecule OM stabilizes the data writing characteristics or data reading characteristics.

It is preferable that, in the third direction, the organic molecule OM is disposed between the part 14a of the upper electrode and the read electrode 16. With the configuration described above, the reading of the data of the organic molecule OM is stable.

First Modification Example

An organic molecular memory of a first modification example is different from the organic molecular memory according to the first embodiment in that a part of the second electrode is not provided. That is, the organic molecular memory of the first modification example is different from the organic molecular memory according to the first embodiment in that the upper electrode 14 does not have the part 14a of the upper electrode.

Figure 24:
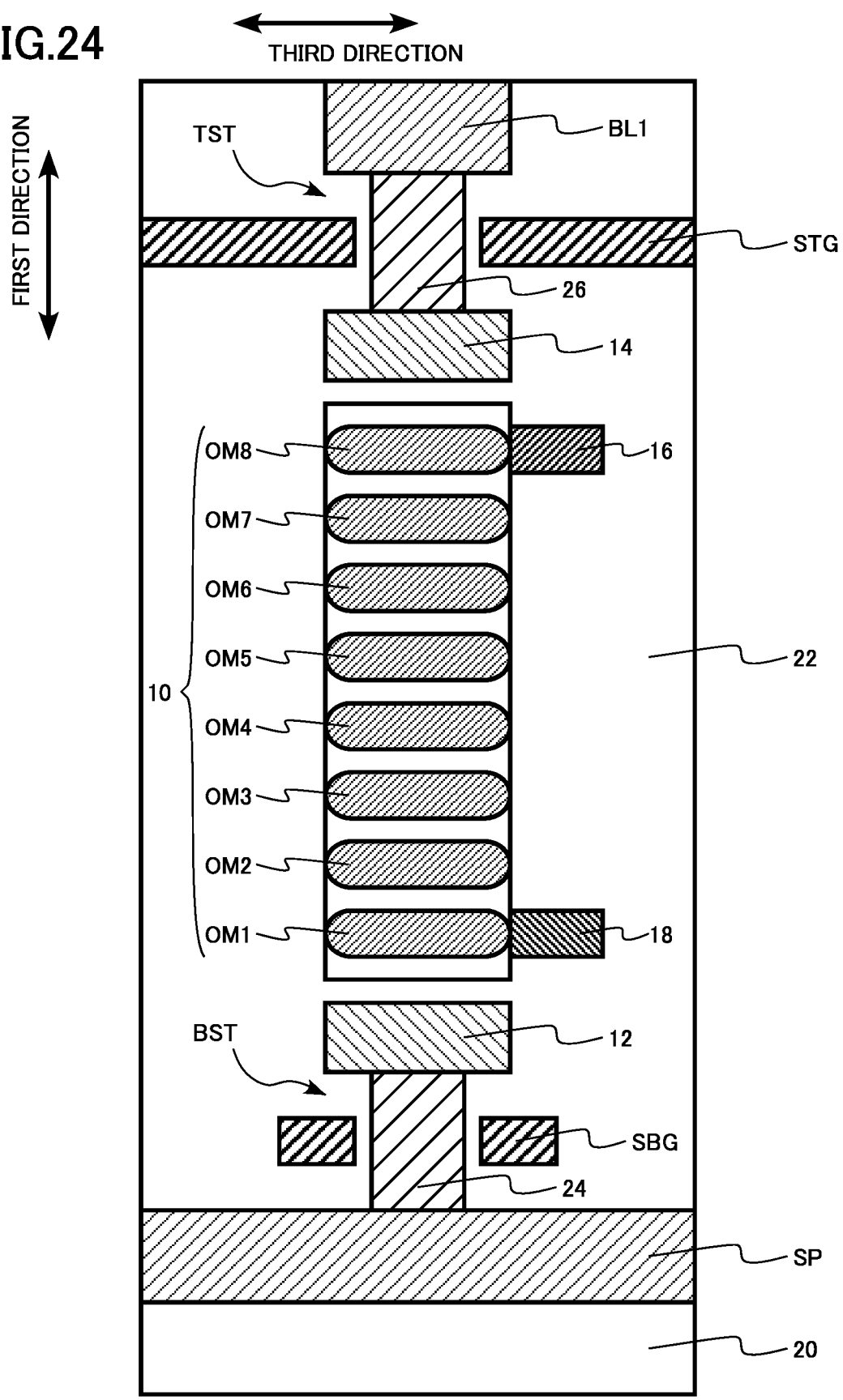
FIG. 24 is a schematic cross-sectional view of an organic molecular memory of a first modification example of the first embodiment.

FIG. 24 is a schematic cross-sectional view of the organic molecular memory of the first modification example of the first embodiment. FIG. 24 is a diagram corresponding to FIG. 3 of the first embodiment.

As shown in FIG. 24, the upper electrode 14 does not have the part 14a of the upper electrode that the upper electrode 14 of the organic molecular memory 100 according to the first embodiment has.

The organic molecular memory of the first modification example can realize a large data capacity and a low cost of the non-volatile memory as in the organic molecular memory 100 according to the first embodiment.

Second Modification Example

An organic molecular memory of a second modification example is different from the organic molecular memory according to the first embodiment in that the organic molecular layer further contains a third molecule provided between the first molecule and the second molecule and a fourth molecule provided between the third molecule and the second molecule, the third electrode faces the fourth molecule, and the fourth electrode faces the third molecule.

Figure 25:
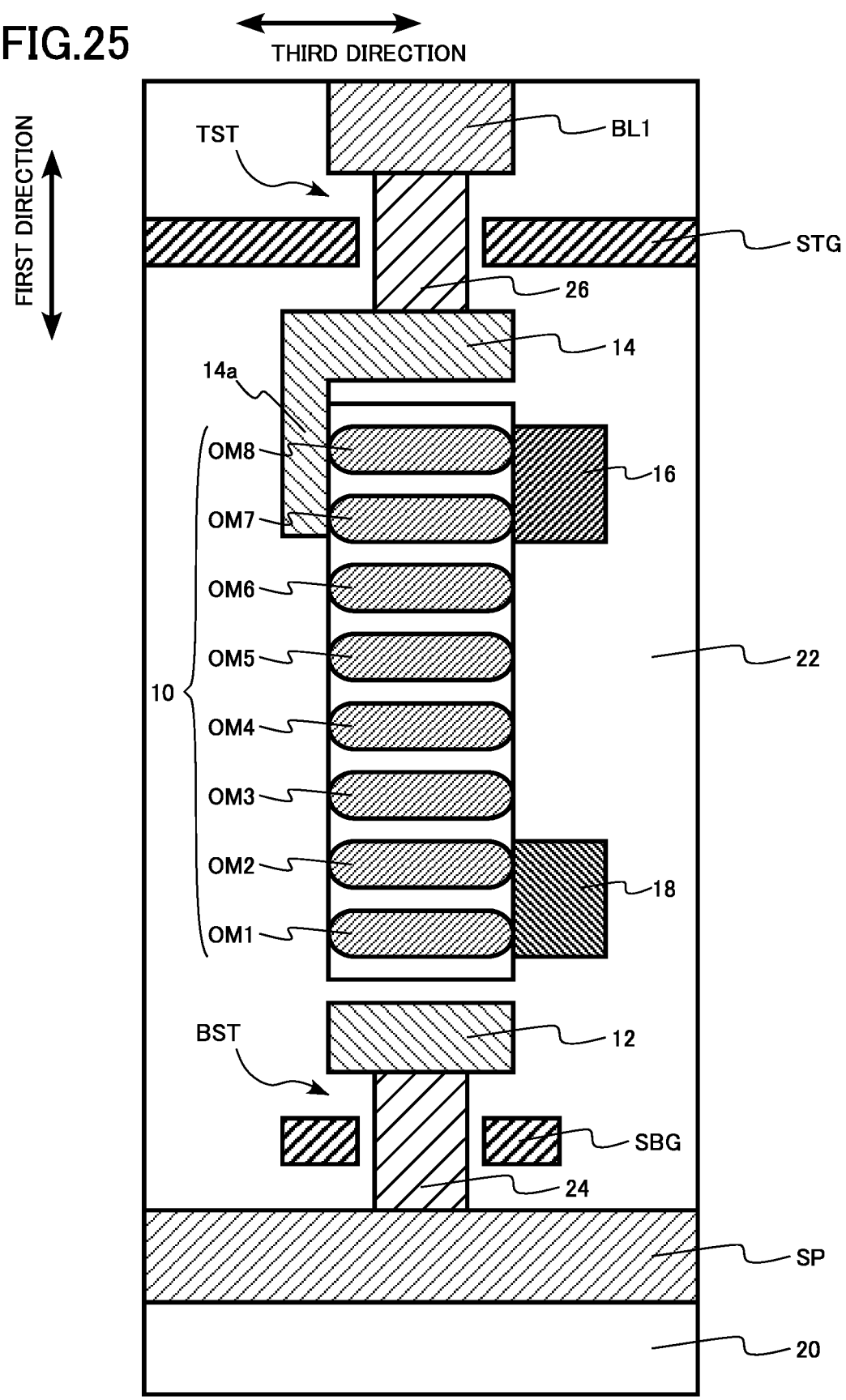
FIG. 25 is a schematic cross-sectional view of an organic molecular memory of a second modification example of the first embodiment.

FIG. 25 is a schematic cross-sectional view of the organic molecular memory of the second modification example of the first embodiment. FIG. 25 is a diagram corresponding to FIG. 3 of the first embodiment.

As shown in FIG. 25, the organic molecular layer 10 contains a first organic molecule OM1, a second organic molecule OM2, a third organic molecule OM3, a fourth organic molecule OM4, a fifth organic molecule OM5, a sixth organic molecule OM6, a seventh organic molecule OM7, and an eighth organic molecule OM8. The first organic molecule OM1 is an example of the first molecule. The eighth organic molecule OM8 is an example of the second molecule. The second organic molecule OM2 is an example of the third molecule. The seventh organic molecule OM7 is an example of the fourth molecule.

In the organic molecular memory of the second modification example, two adjacent organic molecules OM function as one memory cell. Since the two adjacent organic molecules OM function as one memory cell, the data stored in one memory cell can be multi-valued.

The write electrode 18 faces two organic molecules OM, the first organic molecule OM1 and the second organic molecule OM2. Since the write electrode 18 faces the two organic molecules OM of the first organic molecule OM1 and the second organic molecule OM2, data can be simultaneously written to the two organic molecules OM of the first organic molecule OM1 and the second organic molecule OM2.

The read electrode 16 faces two organic molecules OM, the seventh organic molecule OM7 and the eighth organic molecule OM8. In addition, the part 14a of the upper electrode faces two organic molecules OM, the seventh organic molecule OM7 and the eighth organic molecule OM8. Since the read electrode 16 and the part 14a of the upper electrode face the two organic molecules OM of the seventh organic molecule OM7 and the eighth organic molecule OM8, the data of the two organic molecules OM of the seventh organic molecule OM7 and the eighth organic molecule OM8 can be simultaneously read.

The organic molecular memory of the second modification example can realize a large data capacity and a low cost of the non-volatile memory as in the organic molecular memory 100 according to the first embodiment. In addition, according to the second modification example, the data stored in one memory cell can be multi-valued.

As described above, according to the organic molecular memory of the first embodiment and its modification examples, it is possible to realize a large data capacity and a low cost of the organic molecular memory.

Second Embodiment

An organic molecular memory according to a second embodiment is different from the organic molecular memory according to the first embodiment in that the fourth electrode is not provided. Hereinafter, the description of a part of the content overlapping the first embodiment may be omitted.

The organic molecular memory according to the second embodiment is a non-volatile organic molecular memory 200 in which memory cells are three-dimensionally arranged. In the organic molecular memory 200, a memory cell stores data by using the charge in the organic molecule. The organic molecular memory 200 performs a shift register type operation.

Figure 26:
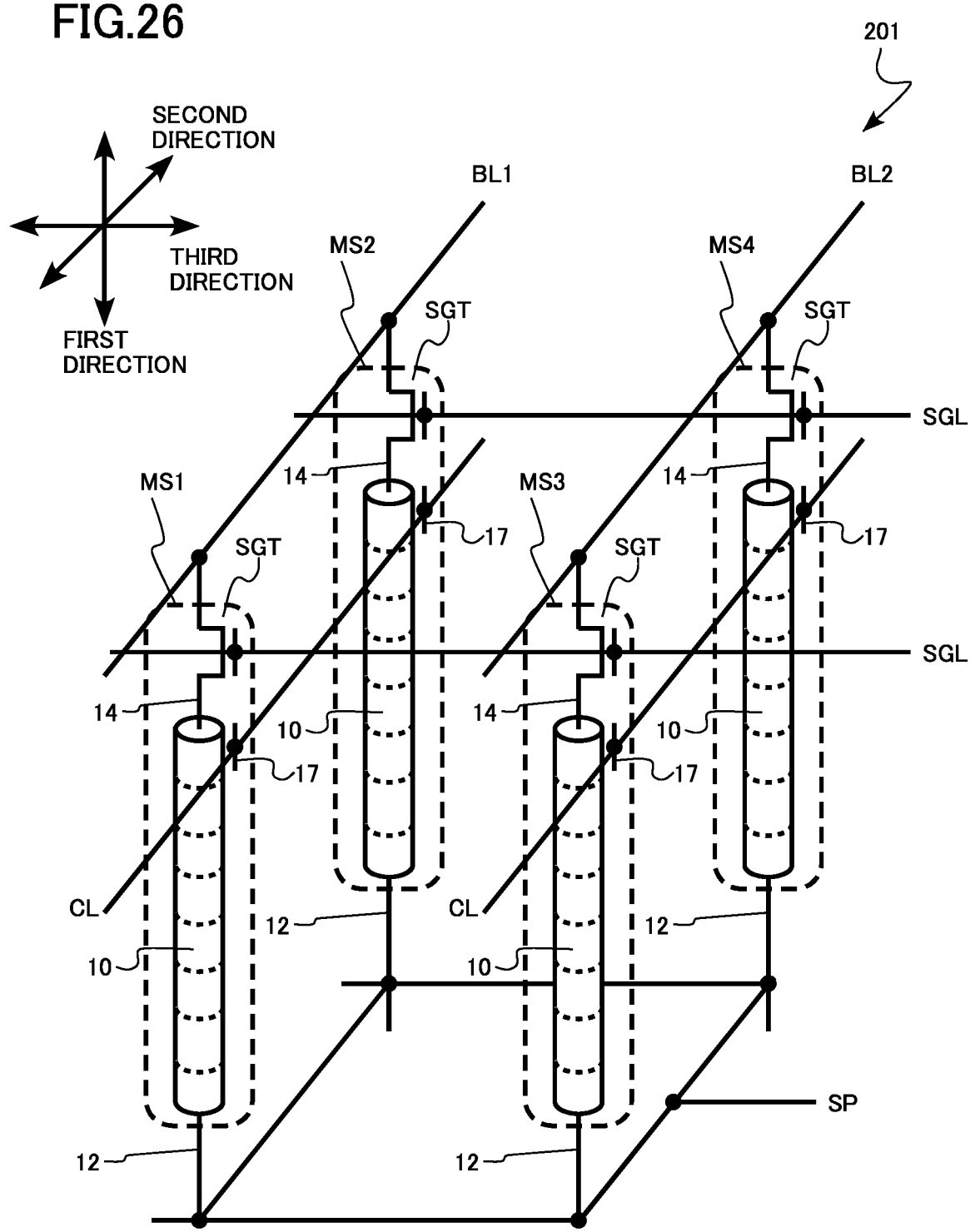
FIG. 26 is an equivalent circuit diagram of a memory cell array of an organic molecular memory according to a second embodiment.

FIG. 26 is an equivalent circuit diagram of a memory cell array of the organic molecular memory according to the second embodiment.

As shown in FIG. 26, a memory cell array 201 includes a first memory string MS1, a second memory string MS2, a third memory string MS3, a fourth memory string MS4, a source plate SP, a select gate line SGL, a common line CL, a first bit line BL1, and a second bit line BL2.

The first bit line BL1 is an example of the first wiring. The second bit line BL2 is an example of the second wiring. The source plate SP is an example of a conductive layer.

Hereinafter, the first memory string MS1, the second memory string MS2, the third memory string MS3, and the fourth memory string MS4 may be referred to individually or collectively as a memory string MS. In addition, the first bit line BL1 and the second bit line BL2 may be referred to individually or collectively as a bit line BL.

Each of the first memory string MS1, the second memory string MS2, the third memory string MS3, and the fourth memory string MS4 includes an organic molecular layer 10, a lower electrode 12, an upper electrode 14, a common electrode 17, and a select gate transistor SGT.

The lower electrode 12 is an example of the first electrode. The upper electrode 14 is an example of the second electrode. The common electrode 17 is an example of the third electrode. The select gate transistor SGT is an example of the first switching element.

In the memory cell array 201, the direction from the lower electrode 12 toward the upper electrode 14 is defined as a first direction. In addition, the direction crossing the first direction is defined as a second direction. In addition, the direction crossing the first direction and the second direction is defined as a third direction. The second direction is, for example, perpendicular to the first direction. In addition, the third direction is, for example, perpendicular to the first direction and the second direction.

As shown in FIG. 26, the first memory string MS1, the second memory string MS2, the third memory string MS3, and the fourth memory string MS4 extend in the first direction.

The first bit line BL1 and the second bit line BL2 extend in the second direction. The first memory string MS1 and the second memory string MS2 are provided between the first bit line BL1 and the source plate SP. The third memory string MS3 and the fourth memory string MS4 are provided between the second bit line BL2 and the source plate SP.

The first bit line BL1 is provided in the first direction of the first memory string MS1 and the second memory string MS2. The first bit line BL1 is provided corresponding to the first memory string MS1 and the second memory string MS2. The second bit line BL2 is provided in the first direction of the third memory string MS3 and the fourth memory string MS4. The second bit line BL2 is provided corresponding to the third memory string MS3 and the fourth memory string MS4. The second bit line BL2 is electrically separated from the first bit line BL1.

The organic molecular layer 10 contains a plurality of organic molecules. Each of the plurality of organic molecules functions as a memory cell.

The select gate transistor SGT is provided between the upper electrode 14 and the first bit line BL1 or between the upper electrode 14 and the second bit line BL2. The select gate line SGL extends in the third direction.

The ON/OFF state of the select gate transistor SGT is controlled by the gate voltage applied to the select gate line SGL. The select gate transistor SGT has a function of selecting a desired memory string MS from a plurality of memory strings MS.

The common line CL extends in the second direction. The common line CL is connected to the common electrode 17. Data is written to the organic molecule facing the common electrode 17 by the write voltage applied to the common line CL. In addition, by detecting the current flowing between the common electrode 17 and the upper electrode 14, the data of the organic molecule facing the common electrode 17 is read.

For example, the common electrode 17 of the first memory string MS1 and the common electrode 17 of the second memory string MS2 are electrically connected to each other by the common line CL. For example, the common electrode 17 of the third memory string MS3 and the common electrode 17 of the fourth memory string MS4 are electrically connected to each other by the common line CL.

Figure 27:
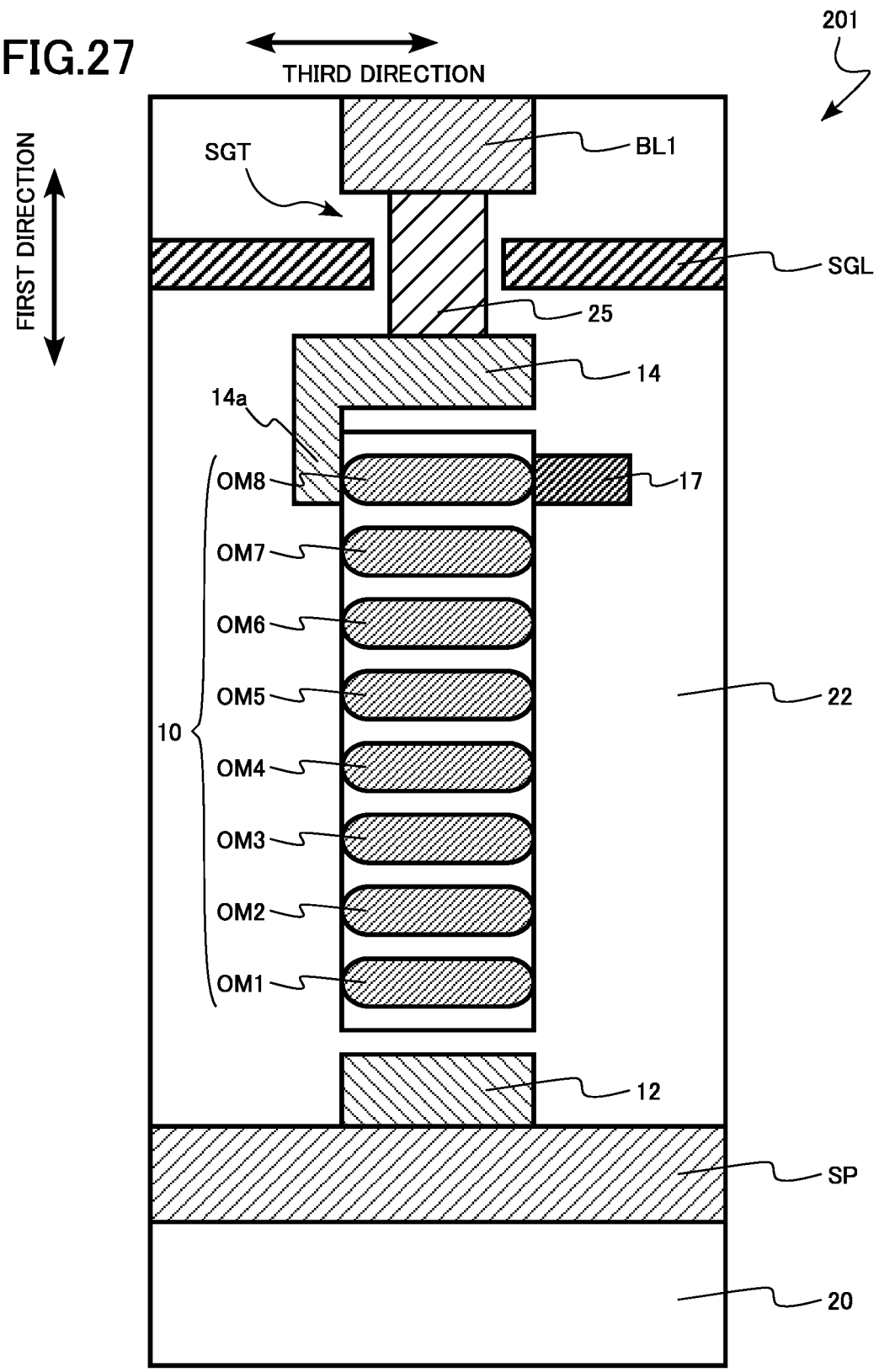
FIG. 27 is a schematic cross-sectional view of the organic molecular memory according to the second embodiment.

FIG. 27 is a schematic cross-sectional view of the organic molecular memory according to the second embodiment. FIG. 27 is a cross-sectional view of the memory cell array 201. FIG. 27 is a cross-sectional view parallel to the first direction and the third direction. FIG. 27 is a cross section including the first memory string MS1.

The memory cell array 201 includes the organic molecular layer 10, the lower electrode 12, the upper electrode 14, the common electrode 17, a substrate insulating layer 20, an interlayer insulating layer 22, the source plate SP, the first bit line BL1, and the select gate transistor SGT.

The lower electrode 12 is an example of the first electrode. The upper electrode 14 is an example of the second electrode. The common electrode 17 is an example of the third electrode. The select gate transistor SGT is an example of the first switching element.

The organic molecular layer 10 contains a first organic molecule OM1, a second organic molecule OM2, a third organic molecule OM3, a fourth organic molecule OM4, a fifth organic molecule OM5, a sixth organic molecule OM6, a seventh organic molecule OM7, and an eighth organic molecule OM8.

The first organic molecule OM1 is an example of the first molecule. The eighth organic molecule OM8 is an example of the second molecule.

Hereinafter, the first organic molecule OM1, the second organic molecule OM2, the third organic molecule OM3, the fourth organic molecule OM4, the fifth organic molecule OM5, the sixth organic molecule OM6, the seventh organic molecule OM7, and the eighth organic molecule OM8 may be referred to individually or collectively as the organic molecule OM.

The substrate insulating layer 20 is, for example, an oxide. The substrate insulating layer 20 is, for example, a silicon oxide.

The source plate SP is provided on the substrate insulating layer 20. The source plate SP is a conductor. The source plate SP is, for example, a metal or a semiconductor. The source plate SP is, for example, tungsten.

The lower electrode 12 is provided between the source plate SP and the organic molecular layer 10.

The lower electrode 12 is electrically connected to the source plate SP. The lower electrode 12 is in contact with, for example, the source plate SP.

The lower electrode 12 is a conductor. The lower electrode 12 is, for example, a metal or a semiconductor. The lower electrode 12 is, for example, tungsten.

The organic molecular layer 10 is provided between the lower electrode 12 and the upper electrode 14. The organic molecular layer 10 extends in the first direction from the lower electrode 12 toward the upper electrode 14.

The first organic molecule OM1, the second organic molecule OM2, the third organic molecule OM3, the fourth organic molecule OM4, the fifth organic molecule OM5, the sixth organic molecule OM6, the seventh organic molecule OM7, and the eighth organic molecule OM8 are stacked in the first direction.

The upper electrode 14 is provided on the organic molecular layer 10. The upper electrode 14 is provided between the organic molecular layer 10 and the first bit line BL1.

A part 14a of the upper electrode faces the eighth organic molecule OM8 in the third direction. The eighth organic molecule OM8 is provided between the part 14a of the upper electrode and the common electrode 17. In the third direction, the eighth organic molecule OM8 is disposed between the part 14a of the upper electrode and the common electrode 17.

The upper electrode 14 is a conductor. The upper electrode 14 is, for example, a metal or a semiconductor. The upper electrode 14 is, for example, tungsten.

The common electrode 17 faces the eighth organic molecule OM8 in the third direction. The distance between the common electrode 17 and the eighth organic molecule OM8 is, for example, shorter than the length of the eighth organic molecule OM8 in the third direction. The distance between the common electrode 17 and the eighth organic molecule OM8 is, for example, shorter than the arrangement pitch of the organic molecule OM in the first direction.

The common electrode 17 has a function of injecting a charge into the eighth organic molecule OM8. The common electrode 17 has, for example, a function of injecting an electron into the eighth organic molecule OM8.

The common electrode 17 has a function of allowing a current to flow through the eighth organic molecule OM8. A current flows through the eighth organic molecule OM8 with the common electrode 17 as one terminal and the upper electrode 14 as the other terminal.

The common electrode 17 is a conductor. The common electrode 17 is, for example, a metal or a semiconductor. The common electrode 17 is, for example, tungsten.

The select gate transistor SGT includes a semiconductor layer 25. The semiconductor layer 25 is provided between the upper electrode 14 and the first bit line BL1. The semiconductor layer 25 is in contact with, for example, the upper electrode 14 and the first bit line BL1.

When the select gate transistor SGT is ON, a channel is formed in the semiconductor layer 25. The semiconductor layer 25 is, for example, polycrystalline silicon.

The upper electrode 14 functions as a source/drain region of the select gate transistor SGT. A part of the first bit line BL1 functions as a source/drain region of the select gate transistor SGT.

A part of the select gate line SGL functions as a gate electrode of the select gate transistor SGT. A gate insulating film (not shown) is provided between a part of the select gate line SGL and the semiconductor layer 25.

The select gate line SGL is a conductor. The select gate line SGL is, for example, a metal. The select gate line SGL is, for example, tungsten.

The first bit line BL1 is a conductor. The first bit line BL1 is, for example, a metal. The first bit line BL1 is, for example, tungsten.

The interlayer insulating layer 22 is, for example, an oxide. The interlayer insulating layer 22 is, for example, a silicon oxide.

Next, the operation of the organic molecular memory 200 will be described.

In the organic molecular memory 200, during a write operation and a read operation, the data stored in the plurality of organic molecules OM stacked in the organic molecular layer 10 is sequentially transferred to the adjacent organic molecules OM. The organic molecular memory 200 performs a so-called shift register type operation during the write operation and the read operation.

FIGS. 28 to 35 are explanatory diagrams of the operation of the organic molecular memory according to the second embodiment.

Figure 28:
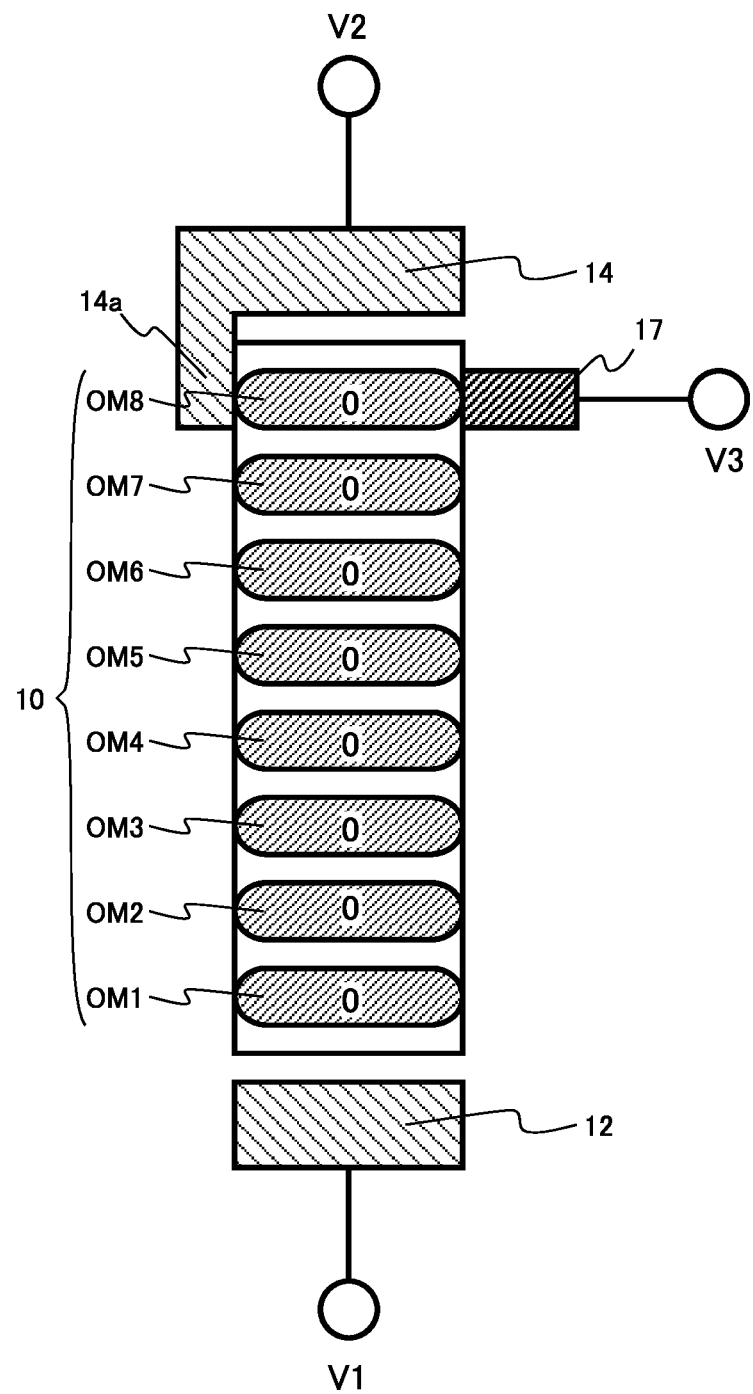
FIG. 28 is an explanatory diagram of the operation of the organic molecular memory according to the second embodiment.

FIG. 28 shows the initial state of the operation of the organic molecular memory 200. In the operation of the organic molecular memory 200, a first voltage V1 is applied to the lower electrode 12, a second voltage V2 is applied to the upper electrode 14, and a third voltage V3 is applied to the common electrode 17.

The state in which no electron is written to the organic molecule OM is defined as data 0. In addition, the state in which an electron is written into the organic molecule OM is defined as data 1.

As shown in FIG. 28, as an initial state of the operation of the organic molecular memory 200, a case where the data stored in all the organic molecules OM is data 0 is considered.

Figure 29:
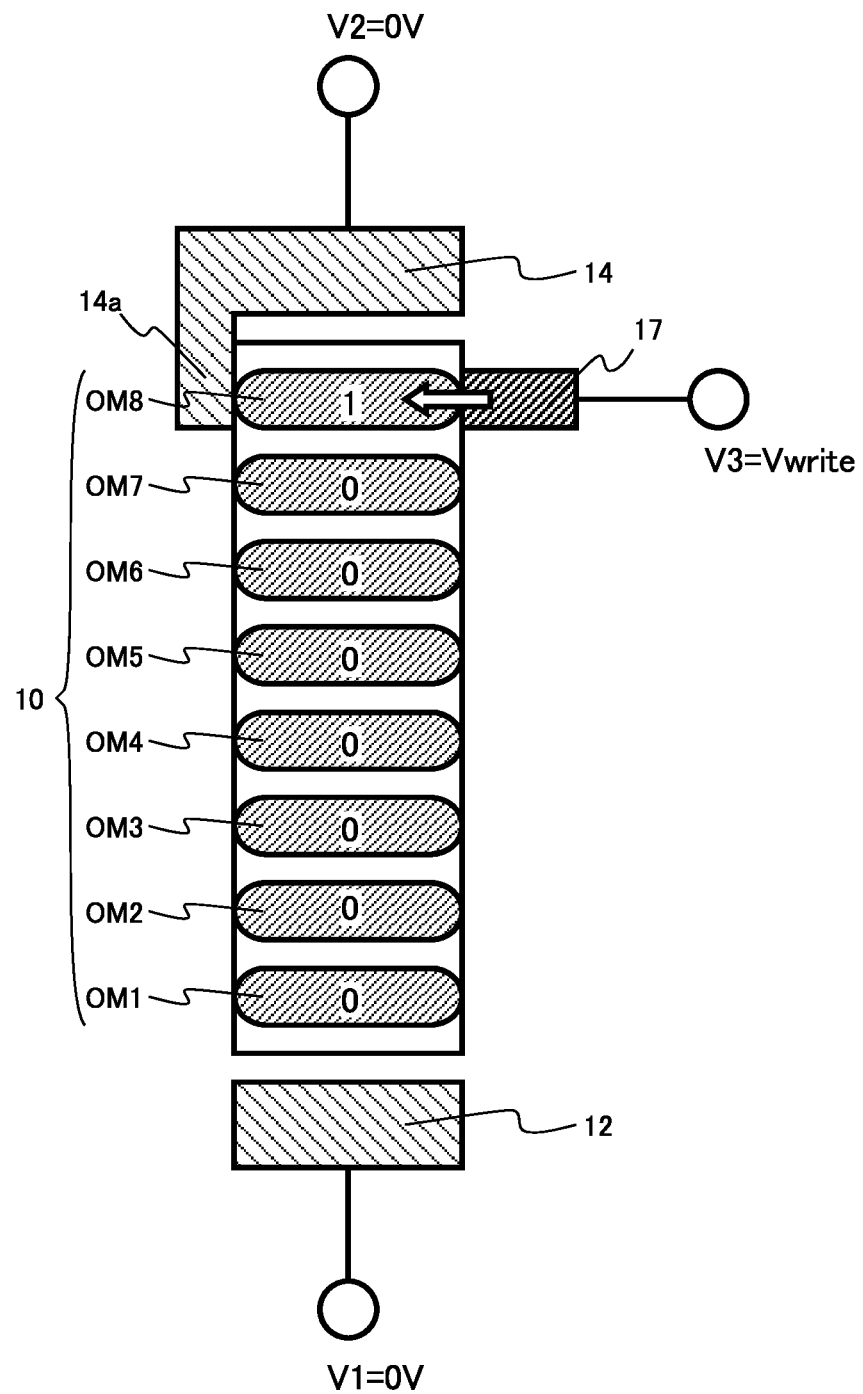
FIG. 29 is an explanatory diagram of the operation of the organic molecular memory according to the second embodiment.

First, as shown in FIG. 29, for example, data 1 is written to the eighth organic molecule OM8. When writing the data 1 to the eighth organic molecule OM8, the third voltage V3 is set to a voltage lower than the second voltage V2. When writing the data 1 to the eighth organic molecule OM8, for example, the second voltage V2 is set to 0 V and the third voltage V3 is set to a write voltage Vwrite. The write voltage Vwrite is a negative voltage.

Electrons are injected from the common electrode 17 into the eighth organic molecule OM8, so that the data 1 is written to the eighth organic molecule OM8. In other words, the data 1 is written by reducing the eighth organic molecule OM8.

In addition, when writing the data 1 to the eighth organic molecule OM8, for example, the first voltage V1 is 0 V.

Figure 30:
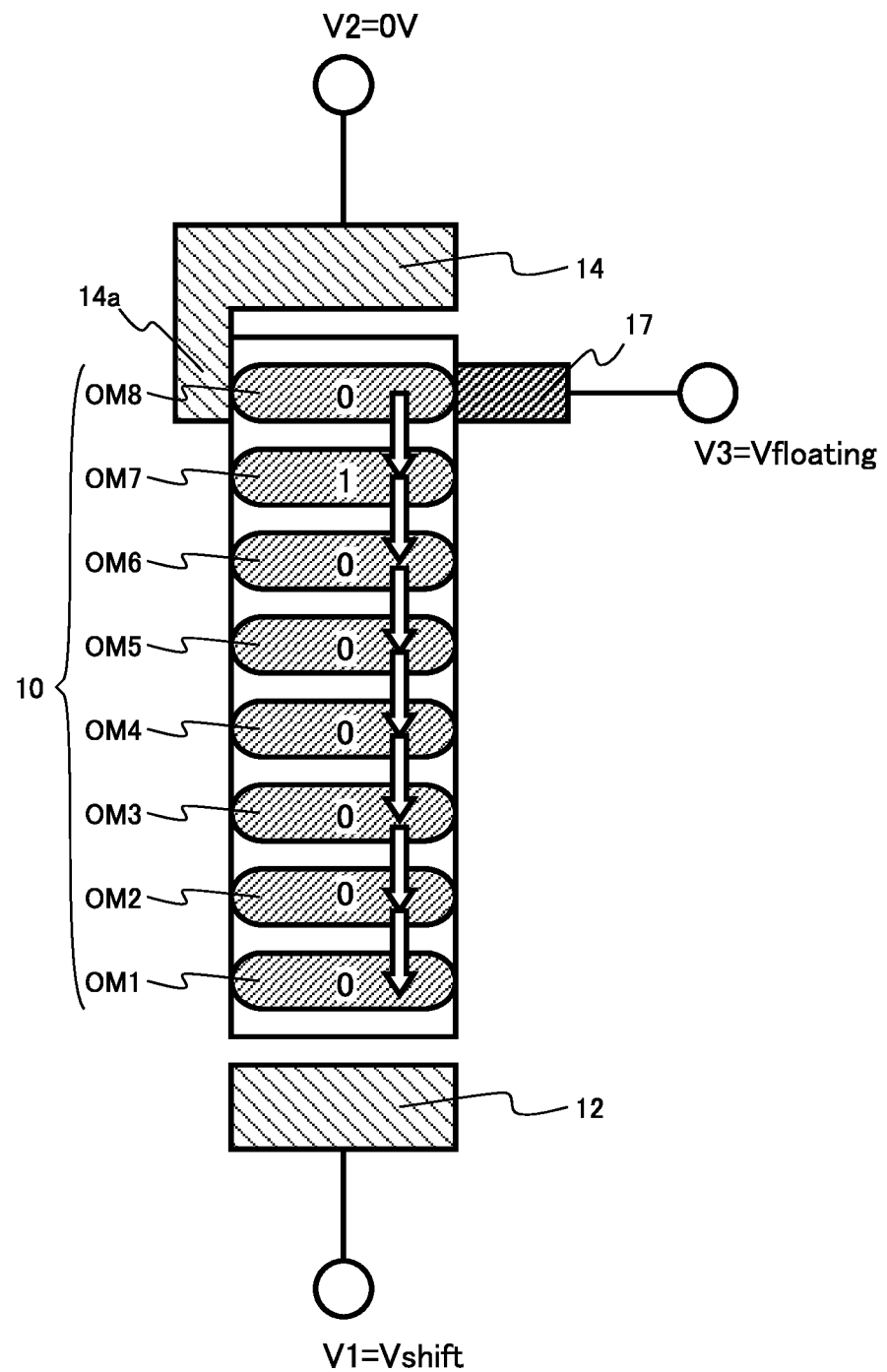
FIG. 30 is an explanatory diagram of the operation of the organic molecular memory according to the second embodiment.

After writing the data 1 to the eighth organic molecule OM8, the data of the organic molecule OM is transferred in a direction from the upper electrode 14 to the lower electrode 12 as shown in FIG. 30. When transferring the data of the organic molecule OM, for example, the second voltage V2 is set to 0 V and the first voltage V1 is set to a shift voltage Vshift. The shift voltage Vshift is a positive voltage. The shift voltage Vshift is applied, for example, as a pulse.

When transferring the data of the organic molecule OM, for example, the common electrode 17 has a floating electric potential. Hereinafter, for convenience of explanation, the state in which the common electrode 17 has a floating electric potential is expressed as "the third voltage V3 is a floating voltage Vfloating".

Figure 31:
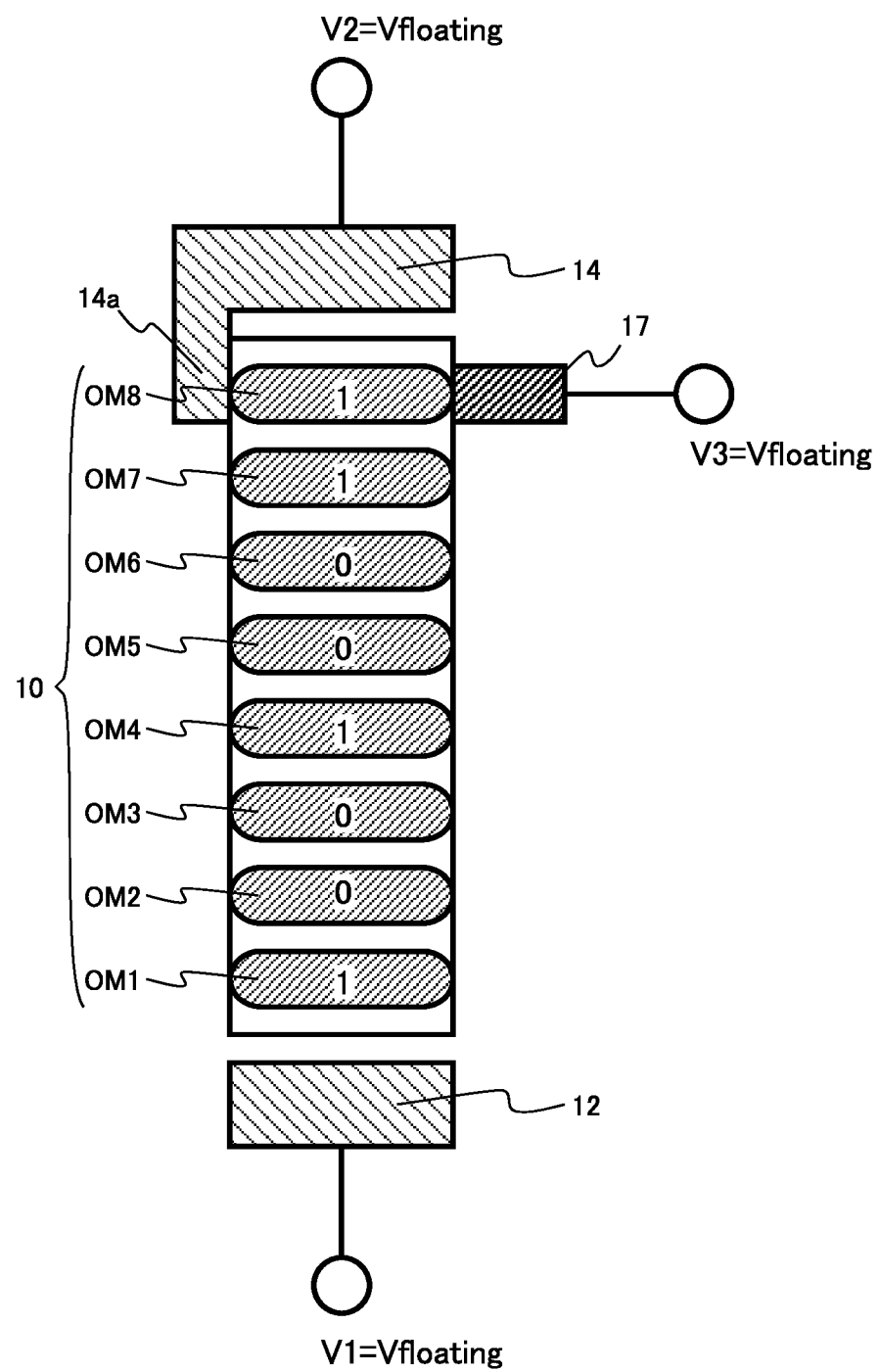
FIG. 31 is an explanatory diagram of the operation of the organic molecular memory according to the second embodiment.

By repeating the writing of the data to the eighth organic molecule OM8 and the transfer of the data of the organic molecule OM, for example, as shown in FIG. 31, data 0 or data 1 is stored in all the organic molecules OM. For example, by maintaining the first voltage V1, the second voltage V2, and the third voltage V3 at the floating voltage Vfloating, the data stored in the organic molecule OM is held. In other words, the organic molecular memory 200 functions as a non-volatile memory capable of holding data even when a power supply voltage is not applied.

Figure 32:
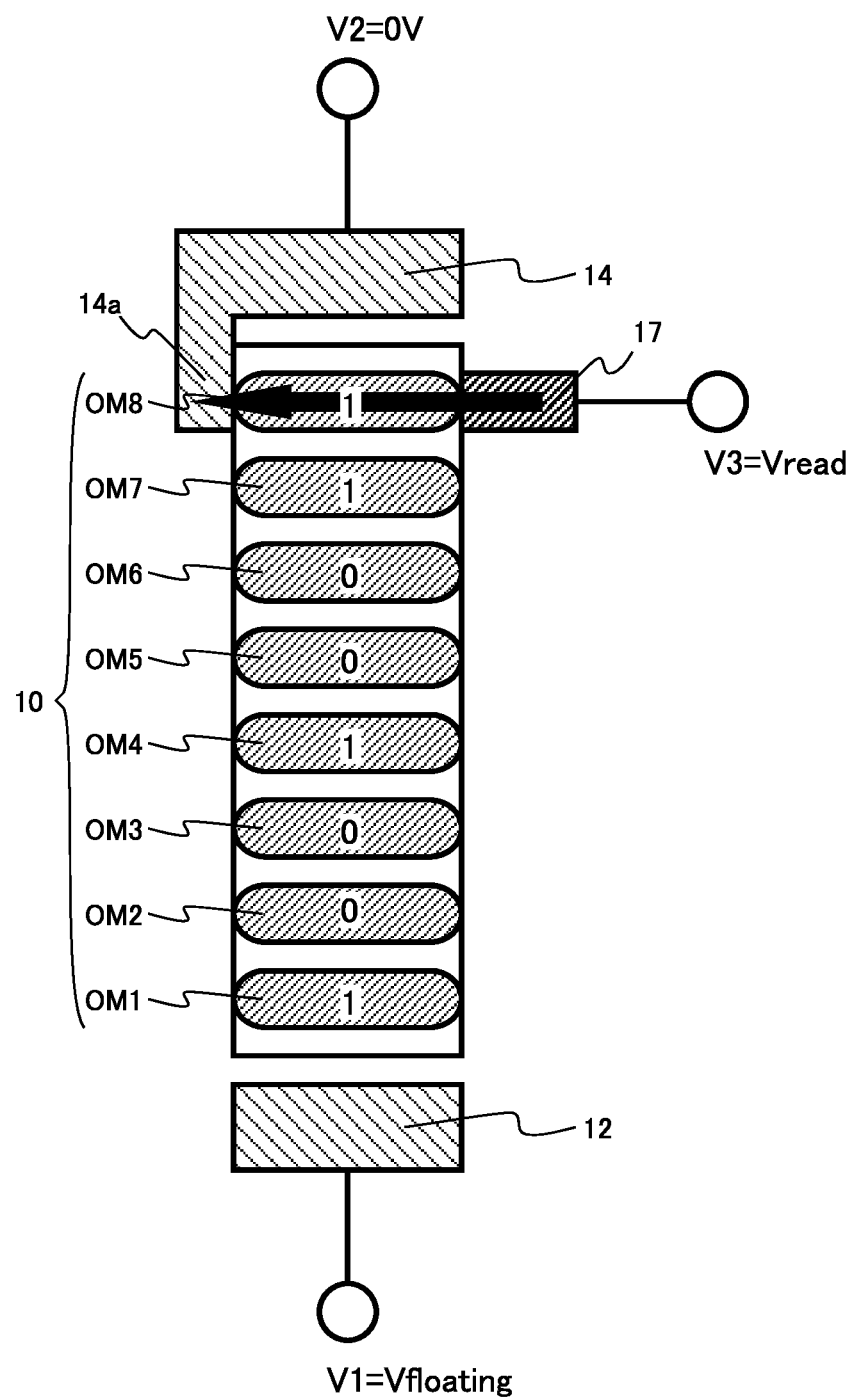
FIG. 32 is an explanatory diagram of the operation of the organic molecular memory according to the second embodiment.

Then, as shown in FIG. 32, the data of the eighth organic molecule OM8 is read. When reading the data of the eighth organic molecule OM8, for example, the second voltage is set to 0 V and the third voltage is set to a read voltage Vread. The read voltage Vread is a positive voltage. The absolute value of the read voltage Vread is, for example, lower than the absolute value of the write voltage Vwrite.

A current flows from the common electrode 17 to the part 14a of the upper electrode through the eighth organic molecule OM8. The magnitude of the current flowing through the eighth organic molecule OM8 changes depending on the data stored in the eighth organic molecule OM8. For example, when the data stored in the eighth organic molecule OM8 is data 1, a large current flows as compared with a case where the data stored in the eighth organic molecule OM8 is data 0.

The current flowing from the common electrode 17 to the upper electrode 14 flows to the first bit line BL1 through, for example, the select gate transistor SGT turned on. The data of the eighth organic molecule OM8 is read based on the current flowing through the first bit line BL1.

The organic molecular memory 200 reads the data stored in the organic molecule OM by detecting the current flowing from the common electrode 17 to the upper electrode 14.

In addition, when reading the data of the eighth organic molecule OM8, for example, the first voltage V1 is the floating voltage Vfloating.

Figure 33:
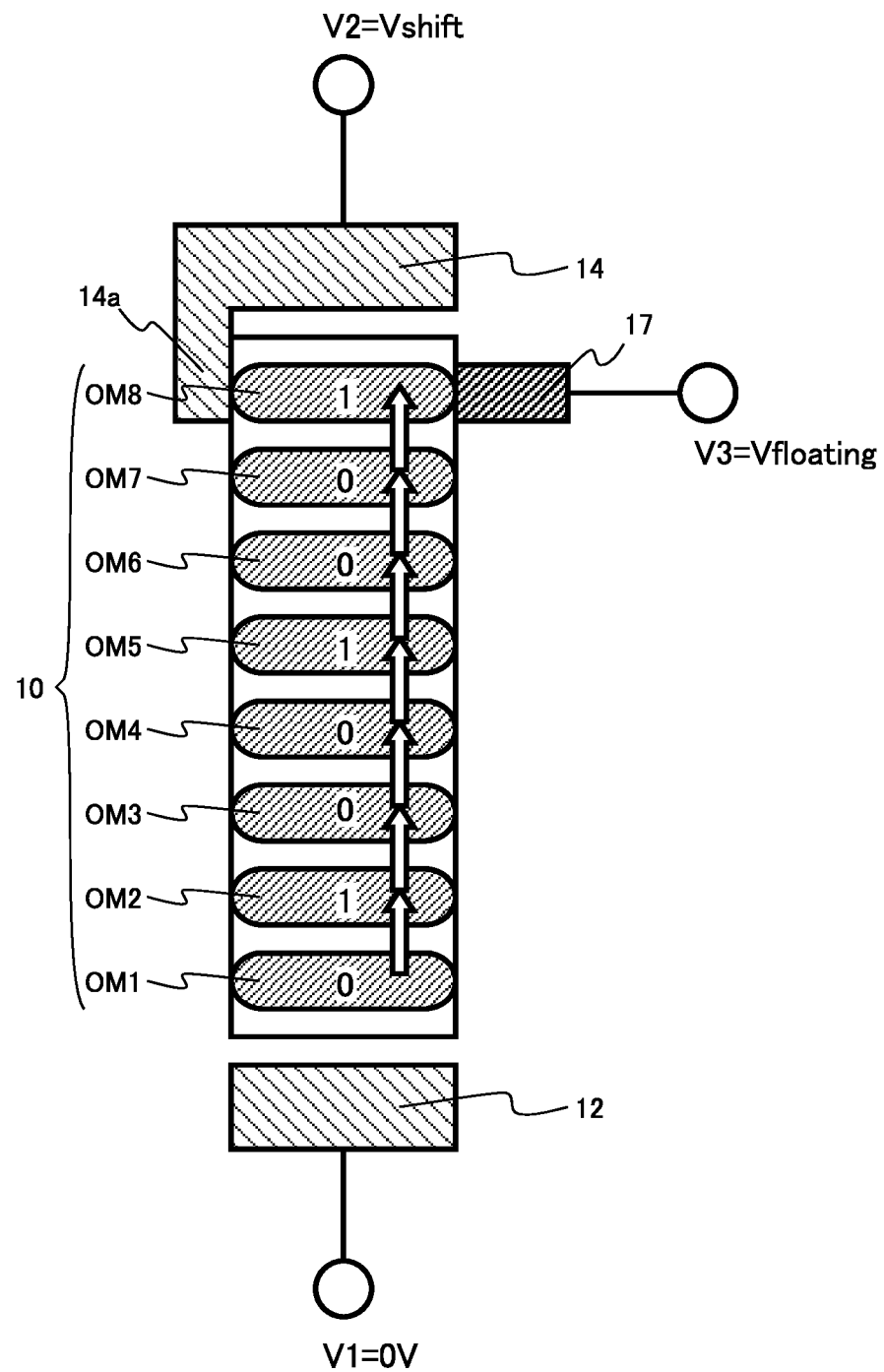
FIG. 33 is an explanatory diagram of the operation of the organic molecular memory according to the second embodiment.

After reading the data of the eighth organic molecule OM8, the data of the organic molecule OM is transferred in a direction from the lower electrode 12 toward the upper electrode 14 as shown in FIG. 33. When transferring the data of the organic molecule OM, for example, the first voltage V1 is set to 0 V and the second voltage V2 is set to a shift voltage Vshift. The shift voltage Vshift is a positive voltage. The shift voltage Vshift is applied, for example, as a pulse. The third voltage V3 is a floating voltage Vfloating.

In addition, for example, the data of the eighth organic molecule OM8 may be erased before the data of the organic molecule OM is transferred. For example, when erasing the data of the eighth organic molecule OM8, the second voltage V2 and the third voltage V3 are set as positive voltages. By setting the second voltage V2 and the third voltage V3 as positive voltages, for example, even if the data 1 is stored in the eighth organic molecule OM8, an electron can be extracted from the eighth organic molecule OM8. As a result, it is possible to reset the data of the eighth organic molecule OM8 to data 0.

Figure 34:
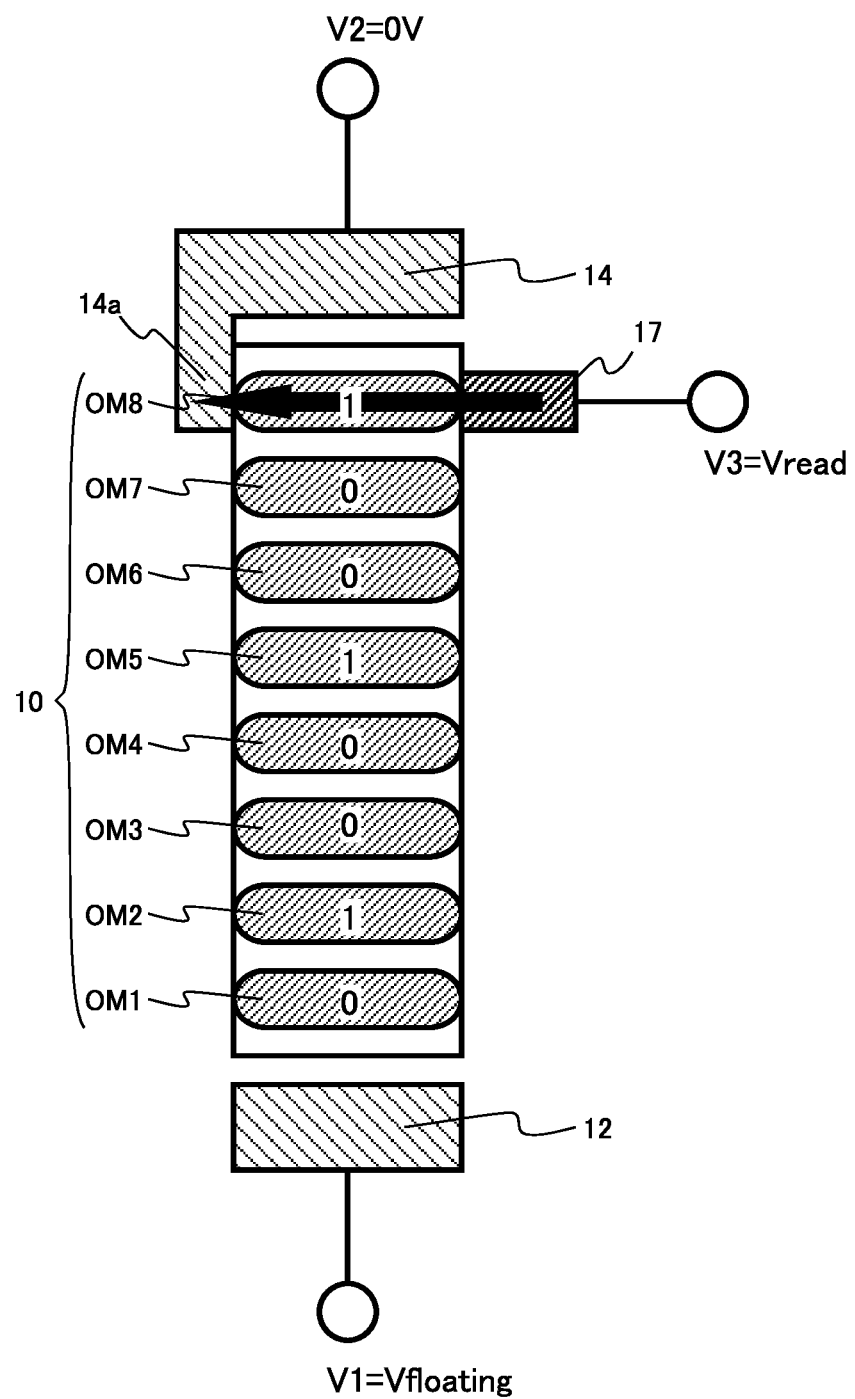
FIG. 34 is an explanatory diagram of the operation of the organic molecular memory according to the second embodiment.

Then, as shown in FIG. 34, the data of the eighth organic molecule OM8 is read. The data of the eighth organic molecule OM8 is the data stored in the seventh organic molecule OM7 before the data transfer. When reading the data of the eighth organic molecule OM8, for example, the second voltage is set to 0 V and the third voltage is set to a read voltage Vread. The first voltage V1 is, for example, the floating voltage Vfloating.

By repeating the reading of the data of the eighth organic molecule OM8 and the transfer of the data of the organic molecule OM, it is possible to read the data stored in all the organic molecules OM of the organic molecular layer 10.

Figure 35:
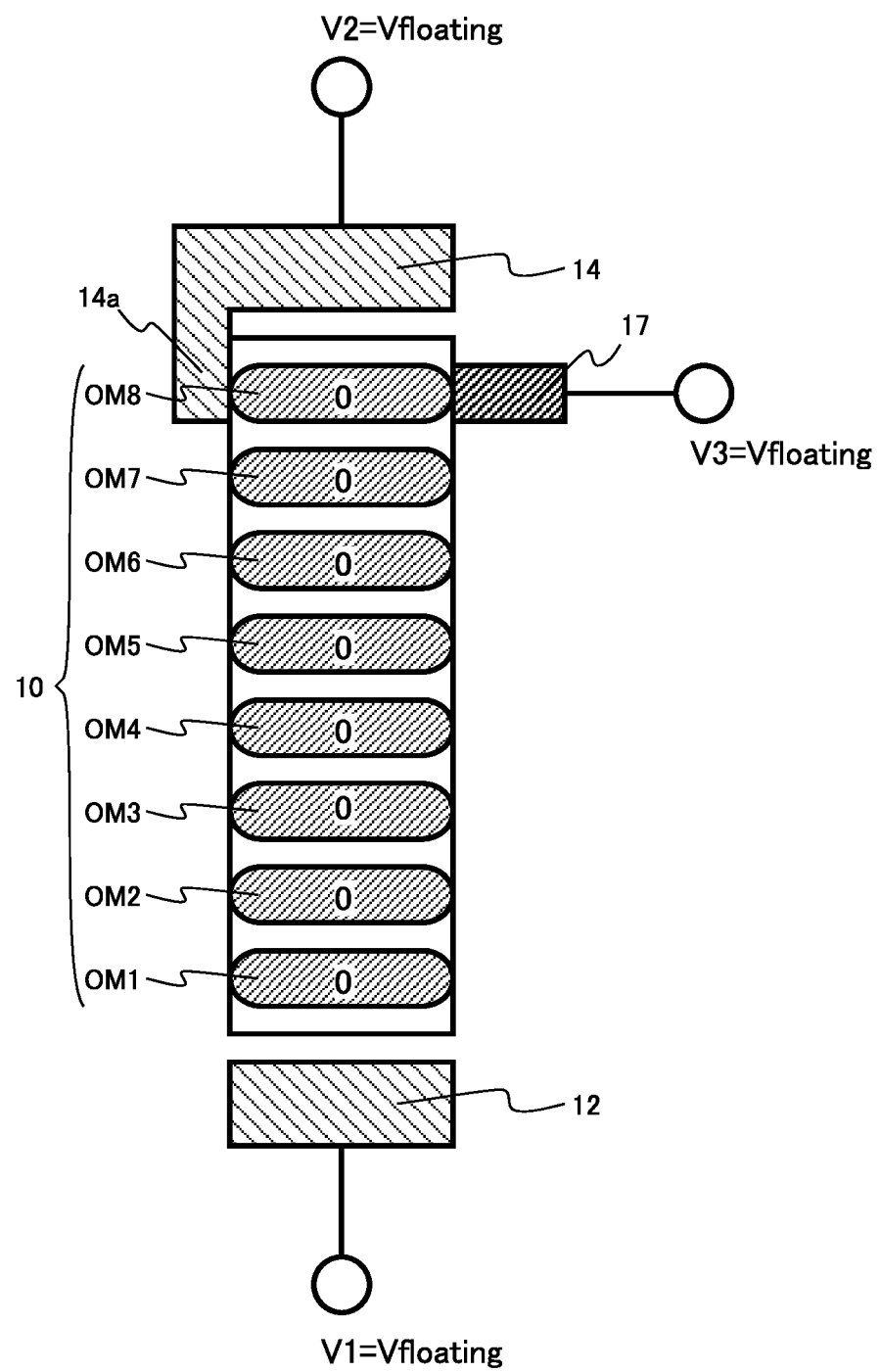
FIG. 35 is an explanatory diagram of the operation of the organic molecular memory according to the second embodiment.

After reading the data stored in all the organic molecules OM, the organic molecular layer 10 returns to the initial state as shown in FIG. 35.

As described above, according to the organic molecular memory according to the second embodiment, it is possible to realize a large data capacity and a low cost of the organic molecular memory as in the organic molecular memory according to the first embodiment.

In the first and second embodiments, the case where the number of organic molecules OM in the organic molecular layer 10 is eight has been described as an example. However, the number of organic molecules OM is not limited to eight. The number of organic molecules OM can be set to any number as long as the number is equal to or more than two.

In the first and second embodiments, the case where the number of memory strings MS is four has been described as an example. However, the number of memory strings MS is not limited to four. The number of memory strings MS can be any number as long as the number is equal to or more than one.

While certain embodiments have been described, these embodiments have been presented by way of example only, and are not intended to limit the scope of the inventions. Indeed, the organic molecular memory described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An organic molecular memory, comprising:
    a first electrode;
    a second electrode;
    an organic molecular layer provided between the first electrode and the second electrode, extending in a first direction from the first electrode toward the second electrode, containing a first molecule and a second molecule, and the second molecule being provided between the first molecule and the second electrode; and
    a third electrode facing the second molecule,
    wherein the second molecule is provided between a part of the second electrode and the third electrode in a second direction crossing the first direction,
    a distance between the part of the second electrode and the second molecule in the second direction is shorter than a length of the second molecule in the second direction,
    the first molecule contains a first cyclic structure with constituent atoms forming a first face,
    the second molecule contains a second cyclic structure with constituent atoms forming a second face, and
    the first face and the second face face each other in the first direction.

2. The organic molecular memory according to claim 1, further comprising:
    a fourth electrode facing the first molecule.

3. The organic molecular memory according to claim 1, wherein the first molecule contains an alkyl group bonded to the first cyclic structure, and
    the second molecule contains an alkyl group bonded to the second cyclic structure.

4. The organic molecular memory according to claim 1, wherein each of the first molecule and the second molecule has a 3-fold or more rotational symmetry.

5. The organic molecular memory according to claim 1, wherein each of the first molecule and the second molecule is a discotic liquid crystal.

6. The organic molecular memory according to claim 1, wherein each of the first molecule and the second molecule is a triphenylene derivative or a porphyrin derivative.

7. The organic molecular memory according to claim 2, wherein the organic molecular layer further contains a third molecule provided between the first molecule and the second molecule and a fourth molecule provided between the third molecule and the second molecule.

8. The organic molecular memory according to claim 7, wherein the third electrode faces the fourth molecule, and the fourth electrode faces the third molecule.

9. The organic molecular memory according to claim 1, wherein the second direction is perpendicular to the first direction.

10. The organic molecular memory according to claim 1, wherein the part of the second electrode is a convex portion protruded from another portion of the second electrode in the first direction towards the first electrode.

11. The organic molecular memory according to claim 1, wherein a distance between the third electrode and the second molecule in the second direction is shorter than the length of the second molecule in the second direction.

12. An organic molecular memory, comprising:
    a first memory string extending in a first direction;
    a second memory string extending in the first direction;
    a third memory string extending in the first direction;
    a first wiring extending in a second direction crossing the first direction and provided corresponding to the first memory string and the second memory string; and
    a second wiring extending in the second direction and provided corresponding to the third memory string,
    wherein each of the first memory string, the second memory string, and the third memory string includes:
    a first electrode;
    a second electrode provided between the first electrode and the first wiring or between the first electrode and the second wiring;
    an organic molecular layer provided between the first electrode and the second electrode, extending in the first direction, containing a first molecule and a second molecule, and the second molecule being provided between the first molecule and the second electrode; and
    a third electrode facing the second molecule,
    wherein the second molecule is provided between a part of the second electrode and the third electrode in a third direction crossing the first direction,
    a distance between the part of the second electrode and the second molecule in the third direction is shorter than a length of the second molecule in the third direction,
    the first molecule contains a first cyclic structure with constituent atoms forming a first face,
    the second molecule contains a second cyclic structure with constituent atoms forming a second face, and
    the first face and the second face face each other in the first direction.

13. The organic molecular memory according to claim 12, wherein each of the first memory string, the second memory string, and the third memory string further includes a fourth electrode facing the first molecule.

14. The organic molecular memory according to claim 12,
wherein each of the first memory string, the second memory string, and the third memory string further includes a first switching element provided between the second electrode and the first wiring or between the second electrode and the second wiring.

15. The organic molecular memory according to claim 14, further comprising:
a conductive layer, the first memory string and the second memory string being provided between the conductive layer and the first wiring and the third memory string being provided between the conductive layer and the second wiring,
wherein each of the first memory string, the second memory string, and the third memory string further includes a second switching element provided between the first electrode and the conductive layer.

16. The organic molecular memory according to claim 12,
wherein the first molecule contains an alkyl group bonded to the first cyclic structure, and
the second molecule contains an alkyl group bonded to the second cyclic structure.

17. The organic molecular memory according to claim 12,
wherein each of the first molecule and the second molecule has a 3-fold or more rotational symmetry.

18. The organic molecular memory according to claim 12,
wherein each of the first molecule and the second molecule is a discotic liquid crystal.

19. The organic molecular memory according to claim 12,
wherein each of the first molecule and the second molecule is a triphenylene derivative or a porphyrin derivative.

20. The organic molecular memory according to claim 13,
wherein the organic molecular layer further contains a third molecule provided between the first molecule and the second molecule and a fourth molecule provided between the third molecule and the second molecule.

21. The organic molecular memory according to claim 20,
wherein the third electrode faces the fourth molecule, and the fourth electrode faces the third molecule.

22. The organic molecular memory according to claim 12,
wherein the third direction is perpendicular to the first direction.

23. The organic molecular memory according to claim 12,
wherein the part of the second electrode is a convex portion protruded from another portion of the second electrode in the first direction towards the first electrode.

24. The organic molecular memory according to claim 12,
wherein a distance between the third electrode and the second molecule in the third direction is shorter than the length of the second molecule in the third direction.

* * * * *